(12) United States Patent
El-Essawy et al.

(10) Patent No.: US 8,279,597 B2
(45) Date of Patent: Oct. 2, 2012

(54) HEATSINK ALLOWING IN-SITU MAINTENANCE IN A STACKABLE MODULE

(75) Inventors: Wael R. El-Essawy, Austin, TX (US); Elmootazbellah N. Elnozahy, Austin, TX (US); Madhusudan K. Iyengar, Woodstock, NY (US); Thomas W. Keller, Jr., Austin, TX (US); Juan C. Rubio, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 168 days.

(21) Appl. No.: 12/788,925

(22) Filed: May 27, 2010

(65) Prior Publication Data

US 2011/0292596 A1 Dec. 1, 2011

(51) Int. Cl.
*H05K 7/20* (2006.01)
*F28F 7/00* (2006.01)
*H05K 5/00* (2006.01)
(52) U.S. Cl. .............. 361/679.49; 361/679.54; 361/697; 361/703; 361/709; 361/715; 165/80.3; 454/184
(58) Field of Classification Search ............ 361/679.47–679.49, 679.54, 697, 703, 710, 709, 715, 361/719; 165/80.3–80.5, 104.33, 185; 257/713–714, 722; 454/184
See application file for complete search history.

(56) References Cited

U.S. PATENT DOCUMENTS

| | | | |
|---|---|---|---|
| 3,277,346 A | * | 10/1966 | McAdam et al. ............. 361/697 |
| 3,648,113 A | | 3/1972 | Rathjen et al. |
| 3,754,596 A | | 8/1973 | Ward |
| 3,904,933 A | | 9/1975 | Davis |
| 4,122,508 A | | 10/1978 | Rumbaugh |
| 4,186,422 A | | 1/1980 | Laermer |
| 4,841,355 A | | 6/1989 | Parks |
| 5,053,856 A | | 10/1991 | Davidson |

(Continued)

FOREIGN PATENT DOCUMENTS

EP 1566087 B1 8/2005

(Continued)

OTHER PUBLICATIONS

Hu, Jin et al., "Completing High-quality Global Routes", Proc. Int'l. Symp. on Physical Design (ISPD), Mar. 2010, 7 pages.

(Continued)

*Primary Examiner* — Zachary M Pape
(74) *Attorney, Agent, or Firm* — Francis Lammes; Stephen J. Walder, Jr.; Libby Z. Toub

(57) ABSTRACT

A modular processing module allowing in-situ maintenance is provided. The modular processing module comprises a set of processing module sides. Each processing module side comprises a circuit board, a plurality of connectors, and a plurality of processing nodes. Each processing module side couples to another processing module side using at least one connector in the plurality of connectors such that, when all of the set of processing module sides are coupled together, the modular processing module is formed. The modular processing module comprises an exterior connection to a power source and a communication system and at least one heatsink that couples to at least a portion of the plurality of processing nodes on one of the processing module sides and is designed such that, when a set of heatsinks in the modular processing module are installed, an empty space is left in a center of the modular processing module.

13 Claims, 19 Drawing Sheets

U.S. PATENT DOCUMENTS

| | | | |
|---|---|---|---|
| 5,063,475 A | | 11/1991 | Balan |
| 5,181,167 A | | 1/1993 | Davidson et al. |
| 5,270,571 A | | 12/1993 | Parks et al. |
| 5,424,919 A | | 6/1995 | Hielbronner |
| 5,497,288 A | | 3/1996 | Otis et al. |
| 5,546,274 A | | 8/1996 | Davidson |
| 5,568,361 A | | 10/1996 | Ward et al. |
| 5,586,004 A | * | 12/1996 | Green et al. .................. 361/699 |
| 5,691,885 A | | 11/1997 | Ward et al. |
| 5,930,154 A | | 7/1999 | Thalhammer-Reyero |
| 6,008,530 A | | 12/1999 | Kano |
| 6,157,533 A | | 12/2000 | Sallam et al. |
| 6,172,874 B1 | | 1/2001 | Bartilson |
| 6,198,628 B1 | | 3/2001 | Smith |
| 6,229,704 B1 | | 5/2001 | Hoss et al. |
| 6,308,394 B1 | * | 10/2001 | Boe ................................ 29/450 |
| 6,557,357 B2 | | 5/2003 | Spinazzola et al. |
| 6,618,254 B2 | | 9/2003 | Ives |
| 6,628,520 B2 | | 9/2003 | Patel et al. |
| 6,828,675 B2 | | 12/2004 | Memory et al. |
| 6,896,612 B1 | | 5/2005 | Novotny |
| 6,986,066 B2 | | 1/2006 | Morrow et al. |
| 7,009,530 B2 | | 3/2006 | Zigdon et al. |
| 7,038,553 B2 | | 5/2006 | Garner et al. |
| 7,106,590 B2 | | 9/2006 | Chu et al. |
| 7,123,477 B2 | | 10/2006 | Coglitore et al. |
| 7,269,018 B1 | | 9/2007 | Bolich et al. |
| 7,312,987 B1 | | 12/2007 | Konshak |
| 7,352,576 B2 | * | 4/2008 | McClure ....................... 361/695 |
| 7,378,745 B2 | | 5/2008 | Hayashi et al. |
| 7,403,392 B2 | | 7/2008 | Attlesey et al. |
| 7,411,785 B2 | | 8/2008 | Doll |
| 7,414,845 B2 | | 8/2008 | Attlesey et al. |
| 7,427,809 B2 | | 9/2008 | Salmon |
| 7,444,205 B2 | | 10/2008 | Desmond |
| 7,457,118 B1 | | 11/2008 | French et al. |
| 7,511,960 B2 | | 3/2009 | Hillis et al. |
| 7,518,871 B2 | | 4/2009 | Campbell et al. |
| 7,534,167 B2 | | 5/2009 | Day |
| 7,539,020 B2 | | 5/2009 | Chow et al. |
| 7,548,170 B1 | | 6/2009 | Griffel et al. |
| 7,586,747 B2 | | 9/2009 | Salmon |
| 7,599,761 B2 | | 10/2009 | Vinson et al. |
| 7,609,518 B2 | | 10/2009 | Hopton et al. |
| 7,630,795 B2 | | 12/2009 | Campbell et al. |
| 7,657,347 B2 | | 2/2010 | Campbell et al. |
| 7,660,116 B2 | | 2/2010 | Claassen et al. |
| 7,738,251 B2 | | 6/2010 | Clidaras et al. |
| 7,835,151 B2 | | 11/2010 | Olesen |
| 7,864,527 B1 | | 1/2011 | Whitted |
| 8,004,836 B2 | * | 8/2011 | Kauranen et al. ............. 361/690 |
| 8,096,136 B2 | * | 1/2012 | Zheng et al. ..................... 62/3.2 |
| 2005/0061541 A1 | | 3/2005 | Belady |
| 2005/0286226 A1 | * | 12/2005 | Ishii et al. ..................... 361/697 |
| 2007/0095507 A1 | | 5/2007 | Henderson et al. |
| 2007/0121295 A1 | | 5/2007 | Campbell et al. |
| 2007/0217157 A1 | | 9/2007 | Shabany et al. |
| 2007/0235167 A1 | | 10/2007 | Brewer et al. |
| 2007/0256815 A1 | | 11/2007 | Conway et al. |
| 2008/0253085 A1 | | 10/2008 | Soffer |
| 2009/0284923 A1 | * | 11/2009 | Rytka et al. ................... 361/700 |
| 2010/0109137 A1 | | 5/2010 | Sasaki et al. |
| 2011/0292595 A1 | | 12/2011 | El-Essawy et al. |
| 2011/0292596 A1 | | 12/2011 | El-Essawy et al. |
| 2011/0292597 A1 | | 12/2011 | Carter et al. |

FOREIGN PATENT DOCUMENTS

| | | |
|---|---|---|
| GB | 2274738 A | 8/1994 |
| WO | WO2010/019517 A1 | 2/2010 |

OTHER PUBLICATIONS

Moffitt, Michael D. et al., "The Coming of Age of (Academic) Global Routing", ISPD 2008, Apr. 13-16, 2008, 8 pages.
Roy, J.A. et al., "High-performance Routing at the Nanometer Scale", IEEE Trans. on Computer-Aided Design 27 (6), Jun. 2008, pp. 1066-1077.
U.S. Appl. No. 12/788,863.
U.S. Appl. No. 12/789,583.
U.S. Appl. No. 12/789,617.
"IBM System p 570 and System Storage DS4800 Oracle Optimized Warehouse", IBM/Oracle, 2009-2010, 12 pages.
"Oracle Solaris and Sun SPARC Systems—Integrated and Optimized for Enterprise Computing", An Oracle White paper, Jun. 2010, 35 pages.
"Rugged Computer Boards and Systems for Harsh, Mobile and Mission-Critical Environments", http://docs.google.com/viewer?a=v&q=cache:hXSDxxK6ZMkJ:www.prosoft.ru/cms/f/432160.pdf+rack+mounted+air+cooled+convection+stack+computer+memory+module+assembly&hl=en&gl=in&pid=bl&srcid=ADGEESghFg9KMvzmcTvmnYWf_SJViA9wR0N0bTZA_JTVOKFOpLIBdzUvH-cpZnujNEYiKnh, Printed on Sep. 30, 2010, 12 pages.
"Sun Storagetek SL8500 Modular Library System", Oracle, 2008/2010, 6 pages.
Alkalai, Leon, "Advanced Packaging Technologies used in NASA's 3D Space Flight", International Conference & Exhibition on High Density Packaging & MCMs, Apr. 7, 1999, 6 pages.
Culhane, Candy et al., "Marquise—An Embedded High Performance Computer Demonstration", http://docs.google.com/viewer?a=v&q=cache:GAzkbRUVuFcJ:citeseerx.ist.psu.edu/viewdoc/download%3Fdoi%3D10.1.1.30.6885%26rep%3Drep1%26type%3Dpdf+rack+mounted+air+cooled+convection+stack+computer+memory+module+assembly&hl=en&gl=in&pid=bl&srcid=ADGEESgTLgP1g6b, Printed on Sep. 30, 2010, 15 pages.
Ghaffarian, Reza, "3D Chip Scale Package (CSP)", http://trs-new.jpl.nasa.gov/dspace/bitstream/2014/17367/1/99-0814.pdf, Printed on Sep. 29, 2010, 31 pages.
Honer, Ken, "Silent Air-Cooling Technology: A Solution to the Cooling Quandary?", http://www2.electronicproducts.com/Silent_air-cooling_technology_a_solution_to_the_cooling_quandary--article-fapo_Tessera_may2010.html.aspx, May 2010, 5 pages.
Patterson, Michael K. et al., "The State of Data Center Cooling, A Review of Current Air and Liquid Cooling Solutions", Intel, White Paper, Digital Enterprise Group, Mar. 2008, 12 pages.
Straznicky, Ivan et al., "Taking the Heat: Strategies for Cooling SBCs in Commercial and Military Environments", Reprinted from Embedded Computing Design, Jan. 2005, 4 pages.
Office Action mailed Sep. 16, 2011 for U.S. Appl. No. 12/788,863; 13 pages.
Response to Restriction Requirements filed Aug. 11, 2011, U.S. Appl. No. 12/788,863, 6 pages.
Restriction Requirement mailed Jul. 22, 2011 for U.S. Appl. No. 12/788,863; 6 pages.
Response to Office Action filed with the USPTO on Feb. 13, 2012 ; U.S. Appl. No. 12/789,583; 2 pages.
U.S. Appl. No. 13/435,811.
U.S. Appl. No. 13/435,998.
Notice of Allowance mailed Jan. 9, 2012 for U.S. Appl. No. 12/789,583; 27 pages.
Notice of Allowance mailed Dec. 27, 2011 for U.S. Appl. No. 12/788,863; 5 pages.
Response to Office Action filed Dec. 5, 2011, U.S. Appl. No. 12/788,863, 10 pages.
Response to Restriction Requirement filed Jul. 17, 2012, U.S. Appl. No. 12/789,617, 8 pages.
Restriction Requirement mailed Jun. 29, 2012 for U.S. Appl. No. 12/789,617; 6 pages.

* cited by examiner

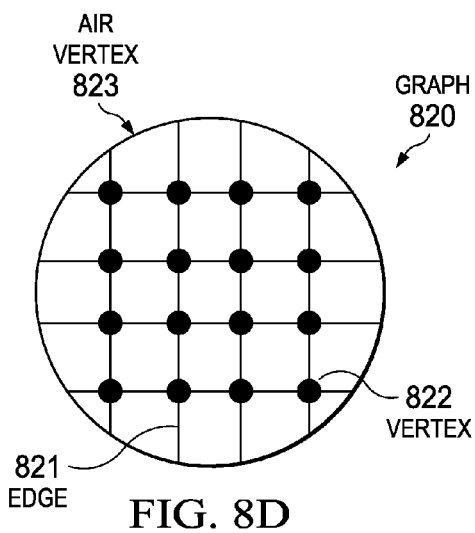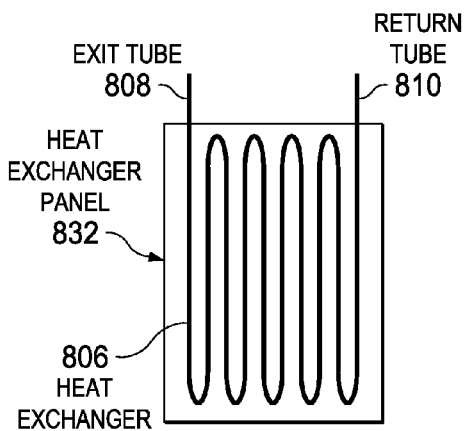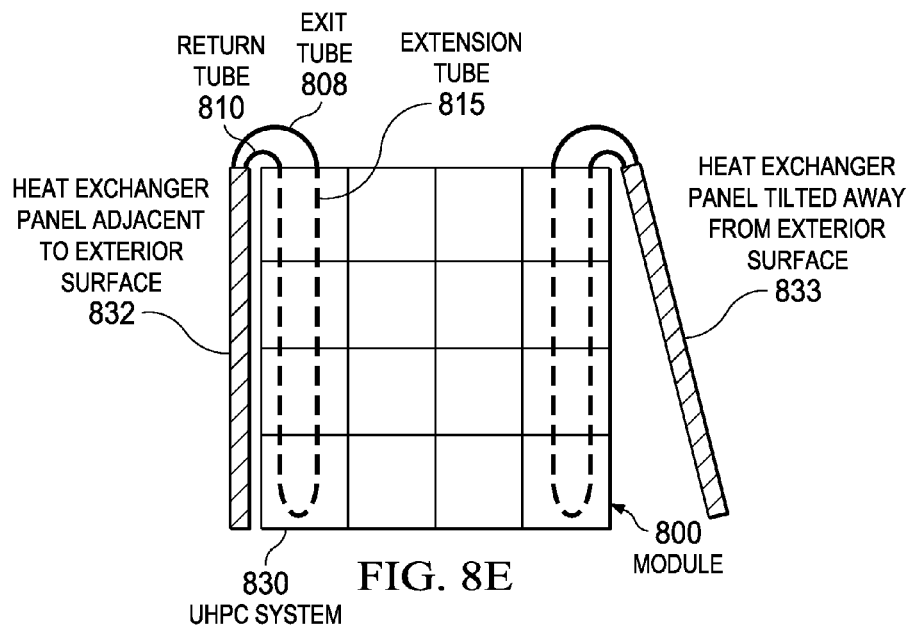

HEATSINK ALLOWING IN-SITU MAINTENANCE IN A STACKABLE MODULE

BACKGROUND

The present application relates generally to an improved data processing apparatus and method and more specifically to mechanisms for a heatsink that allows in-situ maintenance in a stackable module.

High-performance computing (HPC) uses supercomputers and computer clusters to solve advanced computation problems. The HPC term is most commonly associated with computing used for scientific research. A related term, high-performance technical computing (HPTC), generally refers to the engineering applications of cluster-based computing (such as computational fluid dynamics and the building and testing of virtual prototypes). Recently, HPC has come to be applied to business uses of cluster-based supercomputers, such as data intensive, commercial analytics applications, and transaction processing.

However, many HPC systems are hindered by limits in the power consumption, space, cooling, and adaptability. That is HPC systems are composed out of thousands of components which occupy considerable space, require considerable cooling, use massive power, and are not readably deployable.

SUMMARY

In one illustrative embodiment, a modular processing module allowing in-situ maintenance is provided. In the illustrative embodiment, the modular processing module comprises a set of processing module sides. In the illustrative embodiment, each processing module side comprises a circuit board, a plurality of connectors coupled to the circuit board; and a plurality of processing nodes coupled to the circuit board. In the illustrative embodiment, each processing module side in the set of processing module sides couples to another processing module side using at least one connector in the plurality of connectors such that when all of the set of processing module sides are coupled together the modular processing module is formed. In the illustrative embodiment, the modular processing module comprises an exterior connection to a power source and a communication system and at least one heatsink that couples to at least a portion of the plurality of processing nodes on one of the processing module sides. In the illustrative embodiment, the at least one heatsink is designed such that when a set of heatsinks in the modular processing module are installed, an empty space is left in a center of the modular processing module.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein:

FIG. 8D depicts how a three-dimensional very-large-scale integration (VLSI) global routing technique may be applied to generate a layout for the tubes in accordance with an illustrative embodiment;

FIG. 8E depicts another exemplary structure where the heat exchangers along the walls of a module are replaced by heat exchanger panels in accordance with an illustrative embodiment; and FIG. 8F depicts a heat exchanger panel in accordance with an illustrative embodiment.

DETAILED DESCRIPTION

The illustrative embodiments provide a ubiquitous high-performance computing (UHPC) system that packages the thousands of components of a high-performance computing (HPC) system into building-block modules that may be coupled together to form a space-optimized and energy-efficient product. The illustrative embodiments also provide for various heatsink designs that enable an elegant assembly and in place maintenance for the heatsink and the module, while maintaining large effective heat exchange area and high pressure for efficient cooling. The illustrative embodiments also provide for an alternative to air cooling using a liquid cooling system with coolant/air heat exchanging enabled by skin heat exchangers mounted either on the interior or the exterior surface of the UHPC system.

Figure 1:
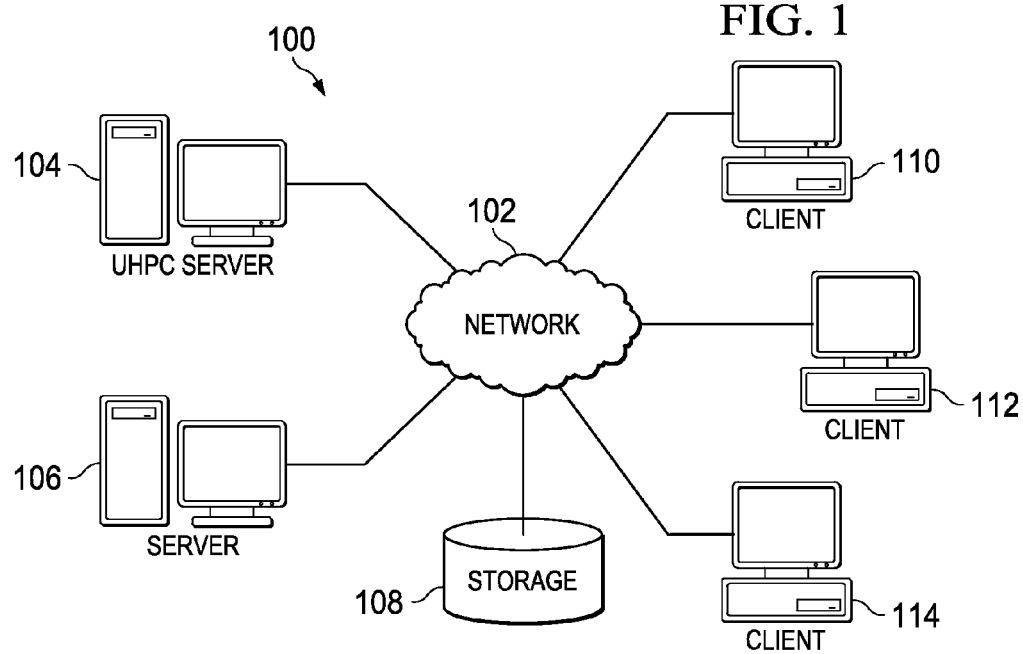
FIG. 1 depicts a pictorial representation of an example distributed data processing system in which aspects of the illustrative embodiments may be implemented.
Figure 2:
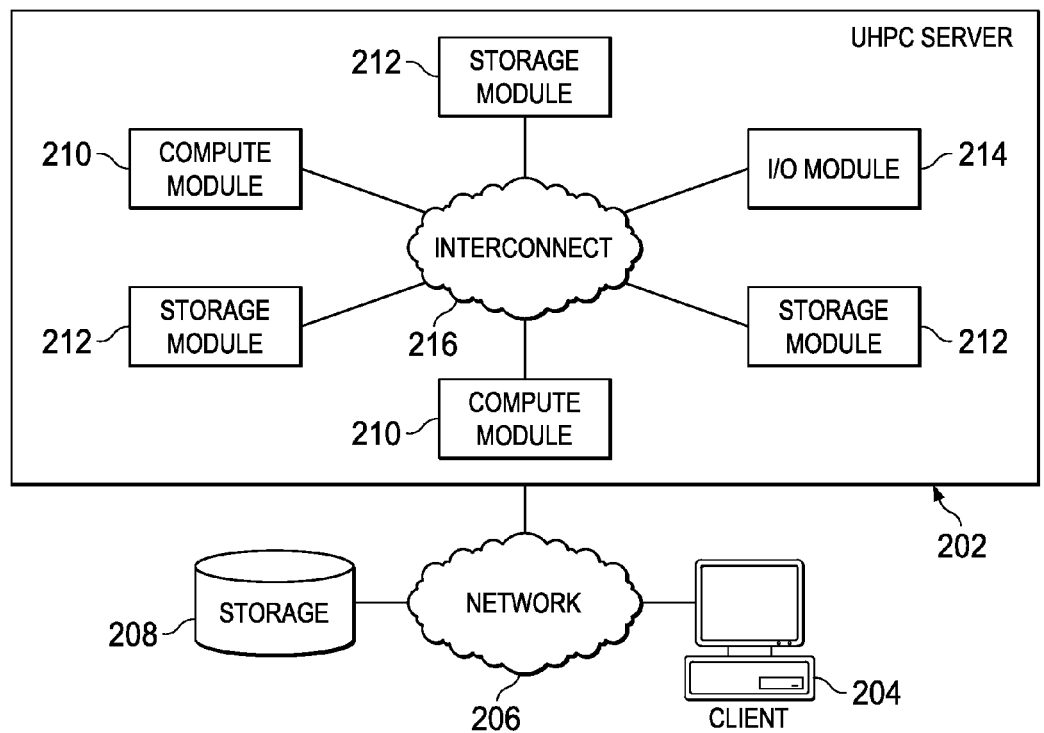
FIG. 2 shows a block diagram of an example data processing system in which aspects of the illustrative embodiments may be implemented.
Figure 3:
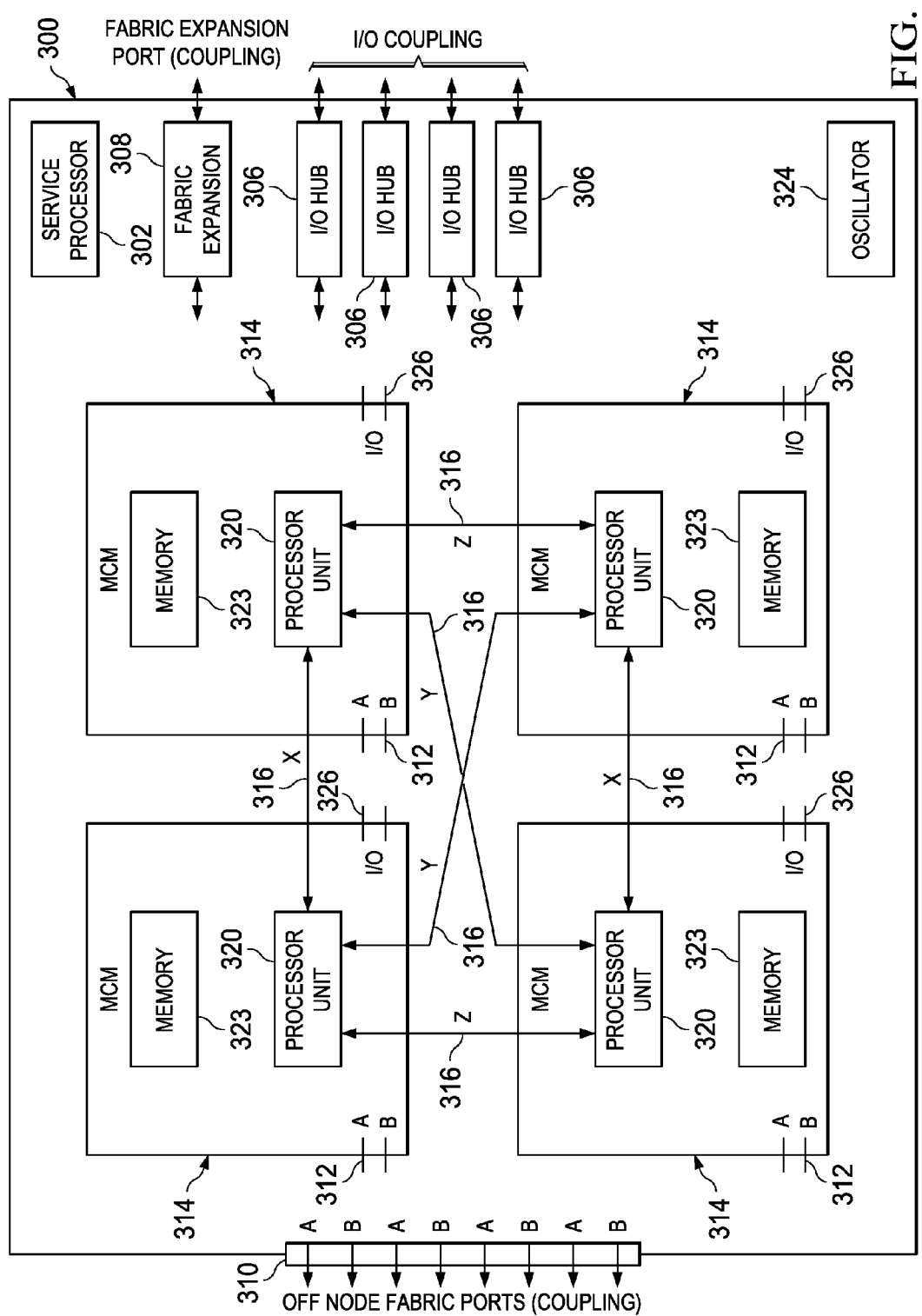
FIG. 3 depicts one exemplary configuration of a symmetric multiprocessor (SMP) system in the form of a processor node in accordance with an illustrative embodiment.

Thus, the illustrative embodiments may be utilized in many different types of data processing environments including a distributed data processing environment, a single data processing device, or the like. In order to provide a context for the description of the specific elements and functionality of the illustrative embodiments, FIGS. 1-3 are provided hereafter as example environments in which aspects of the illustrative embodiments may be implemented. While the description following FIGS. 1-3 will focus primarily on a single data processing device implementation of a ubiquitous high-performance computing (UHPC) system, this is only an example and is not intended to state or imply any limitation with regard to the features of the present invention. To the contrary, the illustrative embodiments are intended to include distributed data processing environments and embodiments in which a ubiquitous high-performance computing (UHPC) system may easily be implemented.

With reference now to the figures and in particular with reference to FIGS. 1-3, example diagrams of data processing environments are provided in which illustrative embodiments of the present invention may be implemented. It should be appreciated that FIGS. 1-3 are only examples and are not intended to assert or imply any limitation with regard to the environments in which aspects or embodiments of the present invention may be implemented. Many modifications to the depicted environments may be made without departing from the spirit and scope of the present invention.

With reference now to the figures, FIG. 1 depicts a pictorial representation of an example distributed data processing system in which aspects of the illustrative embodiments may be implemented. Distributed data processing system 100 may include a network of computers in which aspects of the illustrative embodiments may be implemented. The distributed, data processing system 100 contains at least one network 102, which is the medium used to provide communication links between various devices and computers connected together within distributed data processing system 100. The network 102 may include connections, such as wire, wireless communication links, or fiber optic cables.

In the depicted example, ubiquitous high-performance computing (UHPC) server 104 and server 106 are connected to network 102 along with storage unit 108. In addition, clients 110, 112, and 114 are also connected to network 102. These clients 110, 112, and 114 may be, for example, personal computers, network computers, or the like. In the depicted example, UHPC server 104 provides data, such as boot files, operating system images, and applications to the clients 110, 112, and 114. Clients 110, 112, and 114 are clients to UHPC server 104 in the depicted example. Distributed data processing system 100 may include additional servers, clients, and other devices not shown.

In the depicted example, distributed data processing system 100 is the Internet with network 102 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, the distributed data processing system 100 may also be implemented to include a number of different types of networks, such as for example, an intranet, a local area network (LAN), a wide area network (WAN), or the like. As stated above, FIG. 1 is intended as an example, not as an architectural limitation for different embodiments of the present invention, and therefore, the particular elements shown in FIG. 1 should not be considered limiting with regard to the environments in which the illustrative embodiments of the present invention may be implemented.

With reference now to FIG. 2, a block diagram of an example data processing system is shown in which aspects of the illustrative embodiments may be implemented. Data processing system 200 is an example of a computing system in which computer usable code or instructions implementing the processes for illustrative embodiments of the present invention may be located.

In data processing system 200, ubiquitous high-performance computing (UHPC) server 202 is connected to network 206 along with storage unit 208 and client 204. UHPC server 202 may further comprise one or more of compute modules 210, storage modules 212, and input/output (I/O) modules 214 using interconnect 216. Data processing system 200 may include additional servers, clients, storage devices, and network connects not shown. As with network 102 of FIG. 1, network 206 may represent a worldwide collection of networks and gateways that use any type of communication protocols to communicate with one another. Additionally, data processing system 200 may also be implemented to include a number of different types of networks, such as for example, an intranet, a local area network (LAN), a wide area network (WAN), or the like. FIG. 2 is intended as an example of a UHPC system, not as an architectural limitation for different embodiments of the present invention, and therefore, the particular elements shown in FIG. 2 should not be considered limiting with regard to the environments in which the illustrative embodiments of the present invention may be implemented.

FIG. 3 depicts one exemplary configuration of a symmetric multiprocessor (SMP) system in the form of processor node 300 in accordance with an illustrative embodiment. Processor node 300 may contain one or more of service processor 302, I/O hubs 306, fabric expansion port 308, and off-node fabric expansion ports 310. Fabric expansion port 308 and off-node fabric expansion ports 310 provide connectivity for A and B ports 312 from each of multi-chip modules (MCM) 314 to multi-chip modules on other processor nodes. Fabric ports X, Y, and Z 316 interconnect multi-chip modules 314 within processor node 300.

Additionally, stacked memory chips 323 provide processor memory at each MCM 314. Each of multi-chip modules 314 may be identical in its hardware configuration but configured by firmware during system initialization to support varying system topologies and functions as, e.g. enablement of master and slave functions or connectivity between various combinations of multiple nodes in a scalable multi-node symmetric multi-processor system.

Within a particular multi-chip module 314 there may be found processor unit 320 that may comprise one or more processor cores. Processor node 300 may have one or more oscillators 324 routed to each chip found on processor node 300. Connections between oscillators 324 and functional units extend throughout the board and chips but are not shown in FIG. 3. Similarly, it is understood that many convoluted interconnects exist between fabric expansion port 308, off-node fabric expansion ports 310, and I/O hubs 306 to the various chips on the board, such as A and B ports 312 and I/O ports 326 of multi-chip module 314, among other components, though such interconnects are not shown in FIG. 3. The configuration illustrated in FIG. 3 is just one example of a processing node configuration as is merely shown for illustration purposes. One of ordinary skill in the art would recognize that other processing node implementations may be used in the illustrative embodiments without departing from the spirit and scope of the invention.

Those of ordinary skill in the art will appreciate that the hardware in FIGS. 1-3 may vary depending on the implementation. Other internal hardware or peripheral devices, such as flash memory, equivalent non-volatile memory, or optical disk drives and the like, may be used in addition to or in place of the hardware depicted in FIGS. 1-3. Also, the processes of the illustrative embodiments may be applied to a multiprocessor data processing system, other than the SMP system mentioned previously, without departing from the spirit and scope of the present invention.

Again, the illustrative embodiments provide a ubiquitous high-performance computing (UHPC) system that packages the thousands of components of a high-performance computing (HPC) system into building-block modules that may be coupled together to form a space-optimized and energy-efficient product. In a first embodiment, a modular processing device is composed of a plurality of identical printed circuit boards and processing nodes housed in identical processor packages referred to as processing modules. Each processing module comprises memory, processing layers, and connectivity to power, other processing nodes, storage, input/output (I/O), or the like. The connectivity may be provided through wire, wireless communication links, or fiber optic cables and/or interconnects. In the processing module, various heatsink designs remove heat from the components on each processing node. In addition to the processing module, storage and I/O modules are also provided in similarly formed modules. The storage and I/O modules may be composed of a plurality of printed circuit boards mounting solid state storage devices and/or optical interconnects. The physical design of the modules offers advantages in communication bandwidth, cooling, and manufacturing costs.

In other embodiments, the heatsink designs are a composite design that is comprised of two components: the per processing node cooling component and the common core component. Each heatsink component is mounted directly on one or more processing nodes. Since air flow tends to follow the path of least resistance, one heatsink design fills a majority of the air space such that the flow of air passes between the fins of the heatsink increasing the heat exchange surface area. In another heatsink design, the sizing of the heatsink allows the removal of the heatsink and the processing node from the processing module, while the three other heatsinks remain in place. To enable this type of heatsink design, an empty space is left in the center of the module. Since air flow tends to follow the path of least resistance, to eliminate the loss of beneficial air flow over the heatsinks, a core is inserted into the empty area of the module to fill the air gap, increasing the heat exchange surface area of the heatsinks. The core may be either a solid core that air flows around, increasing the air pressure on the board mounted heatsinks, or may be another heatsink that increases the heat exchange surface area. Since the core is removable, it is still possible to perform in place maintenance tasks on the module, without dissembling the module.

In another embodiment, the modules are combined to create a scalable space optimized and energy efficient ubiquitous high performance computing (UHPC) system. The UHPC system reduces communication cost, reduces cooling cost, provides reliable operation, and facilitates maintainability. The UHPC system does so by using a modular design, where processing nodes are built as modules and assembled as a hexadron (non-regular cube) according to the computing needs of the end-user. This arrangement results in a reduced distance for the communication links, which allows an all-to-all solution.

In still another embodiment, the processing, storage, and/or I/O modules are constructed such that the modules are liquid tight and are then liquid cooled in order to increase heat dissipation. Using liquid cooling provides for more modules to be placed in a UHPC system. In order to cool the liquid flowing through the modules, heat exchangers are coupled to the external surfaces of a UHPC system. Pumping the module coolant between the modules and the heat exchangers circulates the module coolant through the heat exchange elements. Using the external surface of the UHPC system allows heat to be dissipated using ambient air.

While the following embodiments are described with relation to a module of cubical design, the illustrative embodiments are not limited to only a cubical design. That is, other three-dimensional geometric configurations may also be used, such as a rectangular box, without departing from the spirit and scope of the present invention.

Figure 4A:
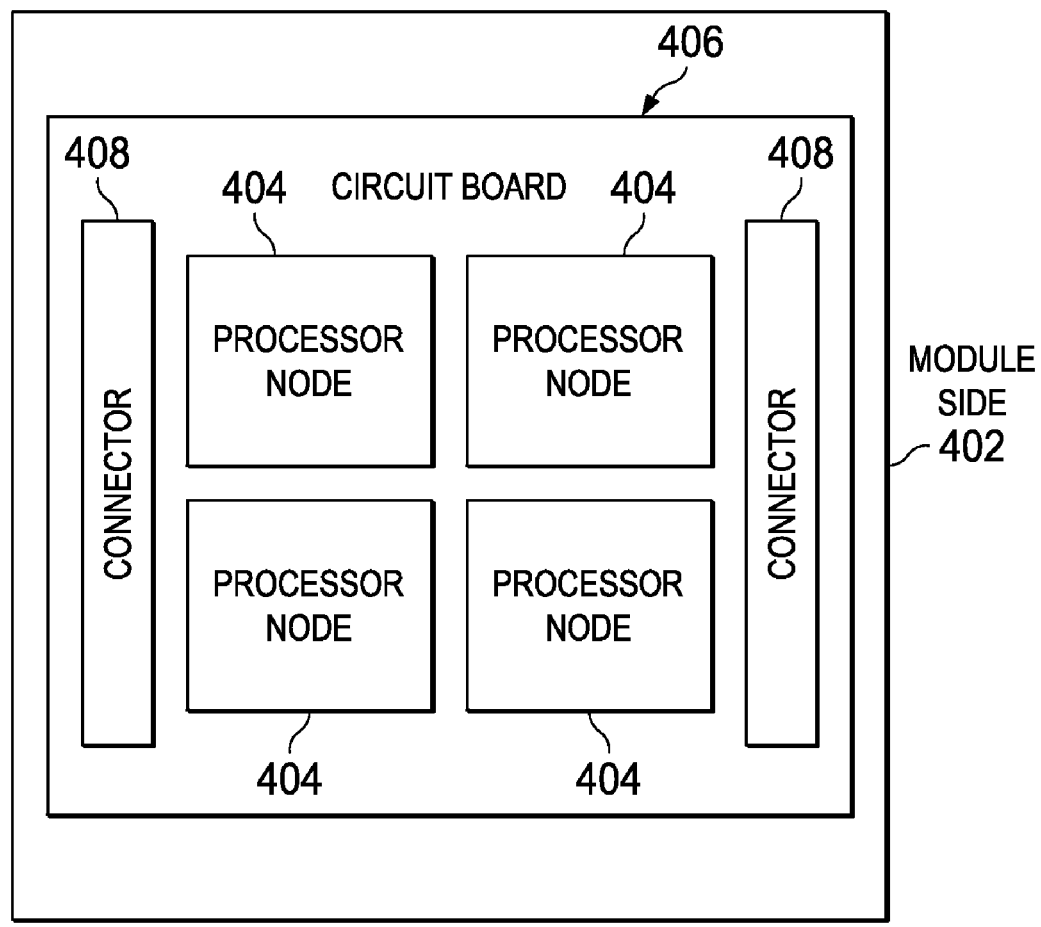
FIG. 4A depicts an example of one side of a processing module in accordance with an illustrative embodiment.

FIG. 4A depicts an example of one side of a processing module in accordance with an illustrative embodiment. In FIG. 4A, processing module side comprises one or more of processing nodes 404 coupled to circuit board 406. Each of processing nodes 404 may comprise memory, processing layers, and connectivity to other ones of processing nodes 404 either coupled directly to circuit board 406 or coupled via connectors 408 to processing nodes on other circuit boards. Processing nodes 404 may be coupled directly to circuit board 406 in a manner in which if one of processing nodes 404 fail, the processing node may removed and replaced with a functional processing node. Similarly, circuit board 406 may also be coupled to processing module side 402 in a manner in which if circuit board 406 fails, the entire circuit board 406 may removed and replaced with a functional circuit board 406. Each of connectors 408 may be any type of connector that provides connectivity to power, other circuit boards, storage, input/output (I/O), or the like. The connectivity provided by connectors 408 may be wire, fiber optic, or the like.

Figure 4B:
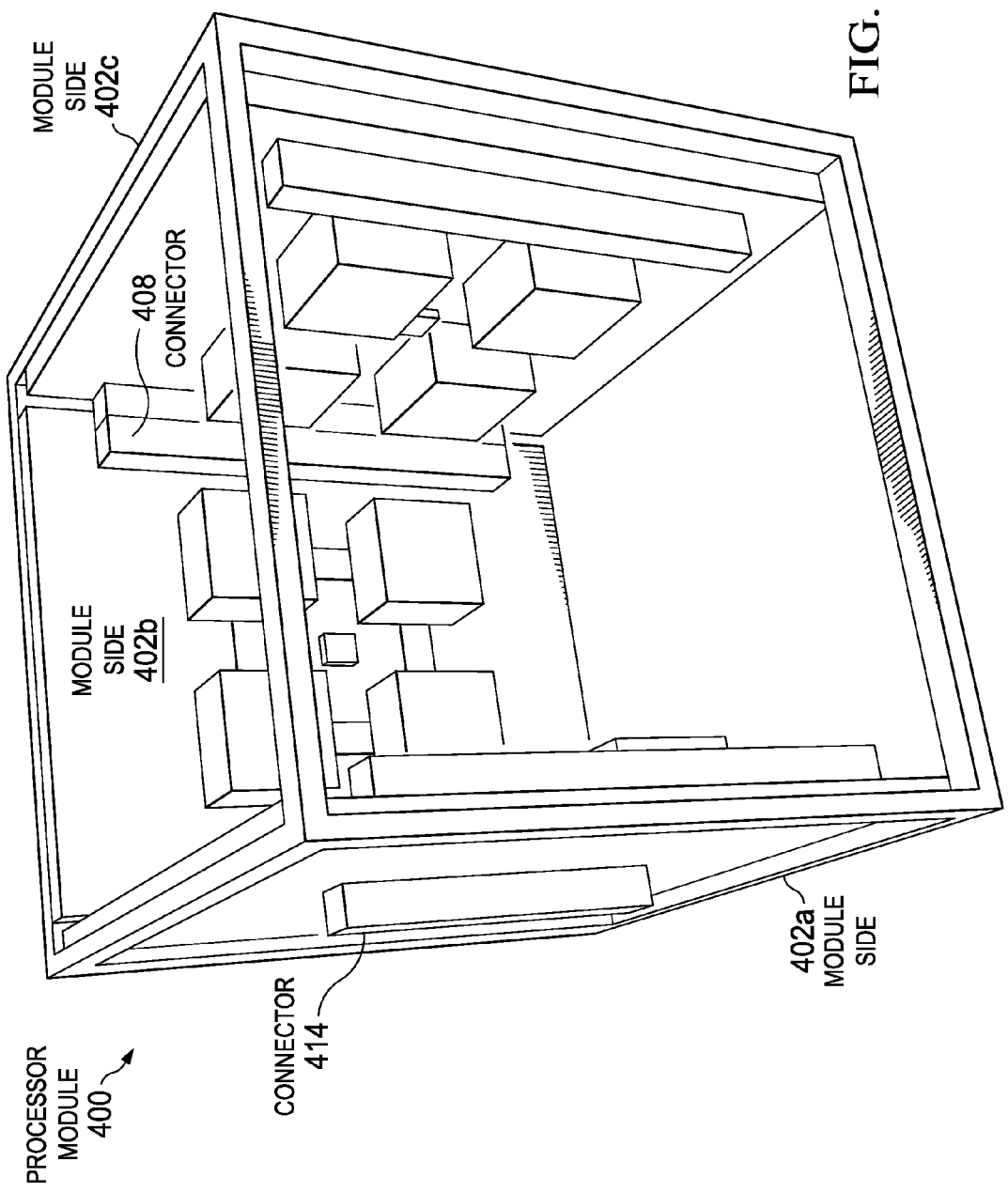
FIG. 4B depicts an exemplary cubical processing module in accordance with an illustrative embodiment.

FIG. 4B depicts an exemplary cubical processing module 400 in accordance with an illustrative embodiment. In FIG. 4B processing module 400 partially constructed showing three processing module sides 402a, 402b, and 402c coupled together. As shown in FIG. 4B, processing module side 402b is coupled to processing module side 402c via connectors, such as connectors 408. Furthermore, processing module side 402a is shown to have exterior connector 414 for interfacing with a backplane of a ubiquitous high performance computing (UHPC) system, which will be described in detail below. While only one of exterior connector 414 is shown, depending on implementation, more than one of external connector 414 may be required for interfacing to the UHPC system.

Figure 4C:
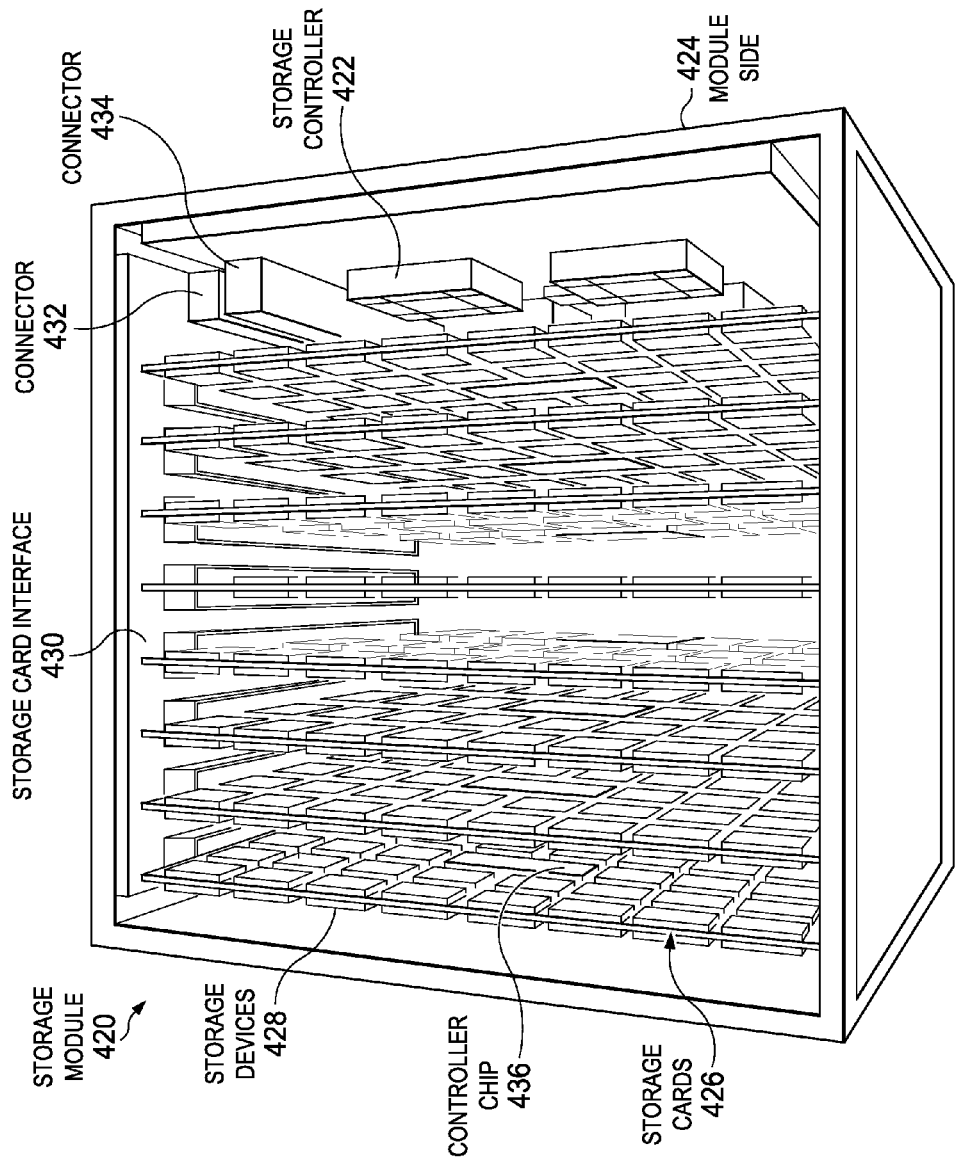
FIG. 4C depicts an exemplary storage module in accordance with an illustrative embodiment.

FIG. 4C depicts an exemplary storage module in accordance with an illustrative embodiment. Storage module 420 may comprise storage controller 422 mounted to storage module side 424. Storage module 420 may also comprise one or more of storage cards 426, which each comprise a plurality of storage devices 428 for storing data, such as storage class memory chips, along with card specific controller chips 436 for interfacing with storage controller 422. Each of storage cards 426 may be coupled to storage card interface 430 which may be coupled to storage controller 422 via connector 432 on storage card interface 430 and connector 434 on storage controller 422. Furthermore, storage module side 424 may have one or more exterior connectors (not shown) for interfacing with a backplane of a ubiquitous high performance computing (UHPC) system, which will be described in detail below.

Figure 4D:
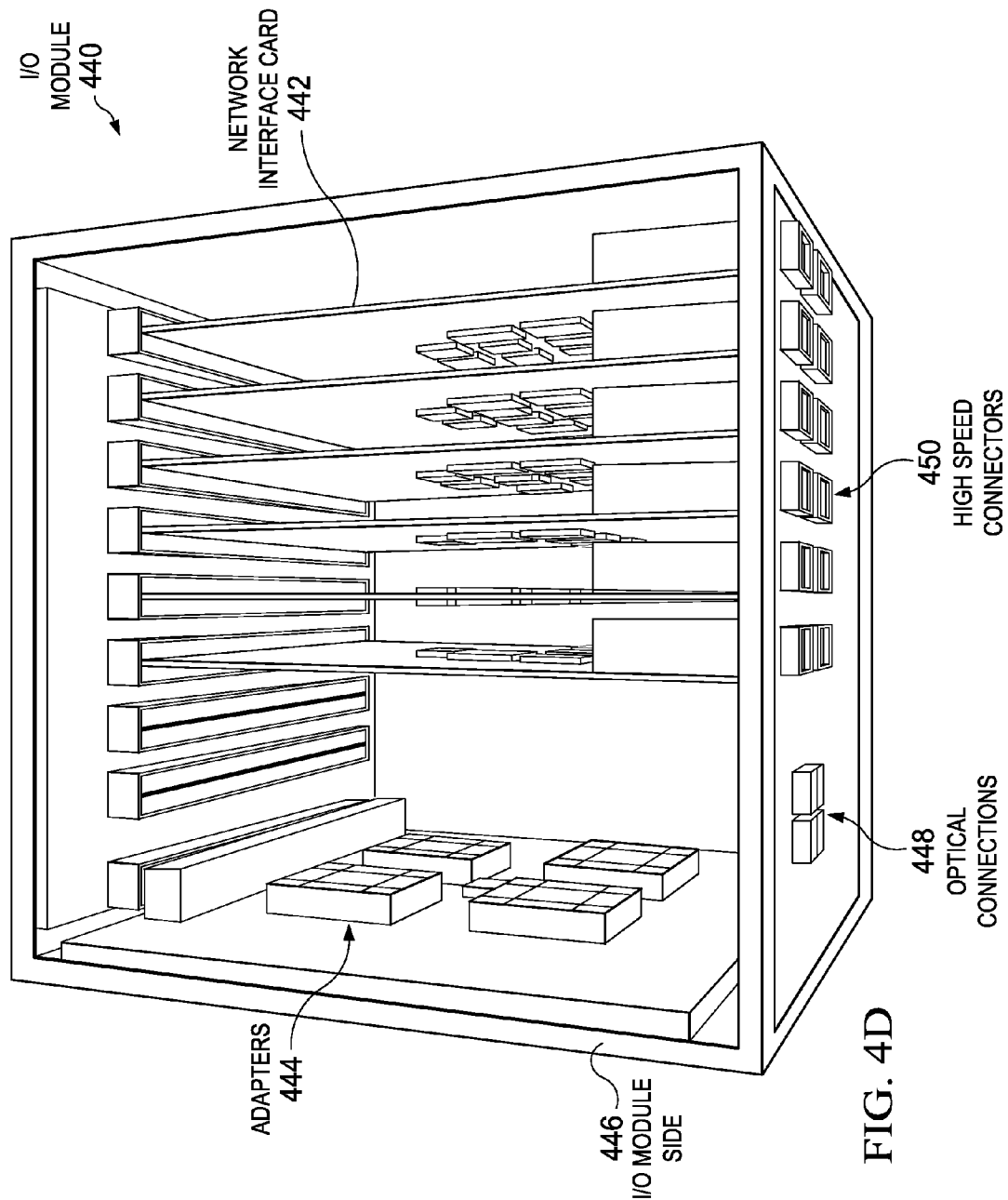
FIG. 4D depicts an exemplary input/output (I/O) module in accordance with an illustrative embodiment.

FIG. 4D depicts an exemplary input/output (I/O) module in accordance with an illustrative embodiment, I/O module 440, which may also be referred to as a network module, provides connectivity for the UHPC system to the outside world. I/O module 440 may comprise a plurality of network interface cards 442 as well as one or more adapters 444 mounted to I/O module side 446. Each of network interface cards 442 may further comprise a plurality of pass-thru optical connections 448, which may be used to connect multiple levels of modules in the UHPC system together. Each of network interface cards 442 may also comprise a plurality of very high speed Ethernet or Infiniband connectors 450.

Figure 4E:
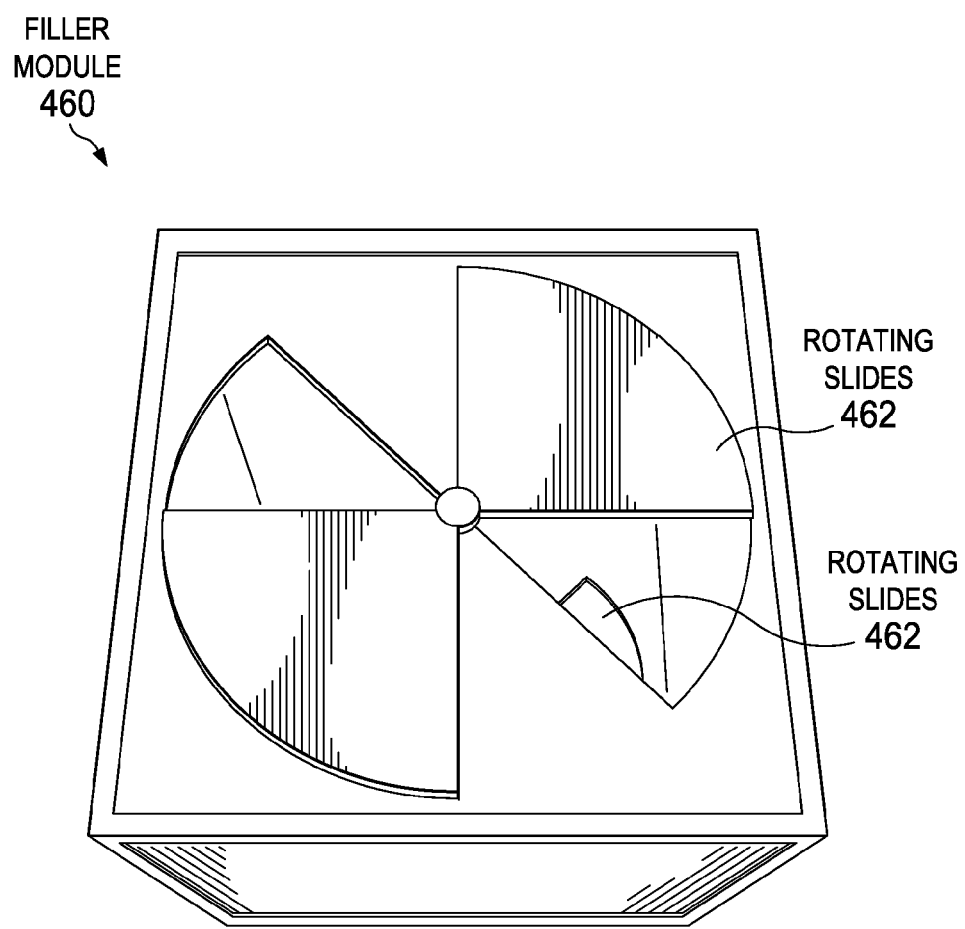
FIG. 4E depicts an exemplary filler module in accordance with an illustrative embodiment.

FIG. 4E depicts an exemplary filler module in accordance with an illustrative embodiment. Filter module 460 comprises top and bottom rotating slides 462 to control the airflow thru filler module 460. Rotating slides 462 provide for different airflow impedances so that depending on the position the filler module is used within the UHPC system, rotating slides 462 may be adjusted to mimic the airflow of processing module 400, storage module 420, or I/O module 440. That is, rotating slides 462 of filler module 460 may be adjusted to provide different airflow impedances such that the airflow impedance of different module types may be matched. This ensures that when filler module 460 is used, air flow properties do not change in other areas of the UHPC system.

Figure 5A:
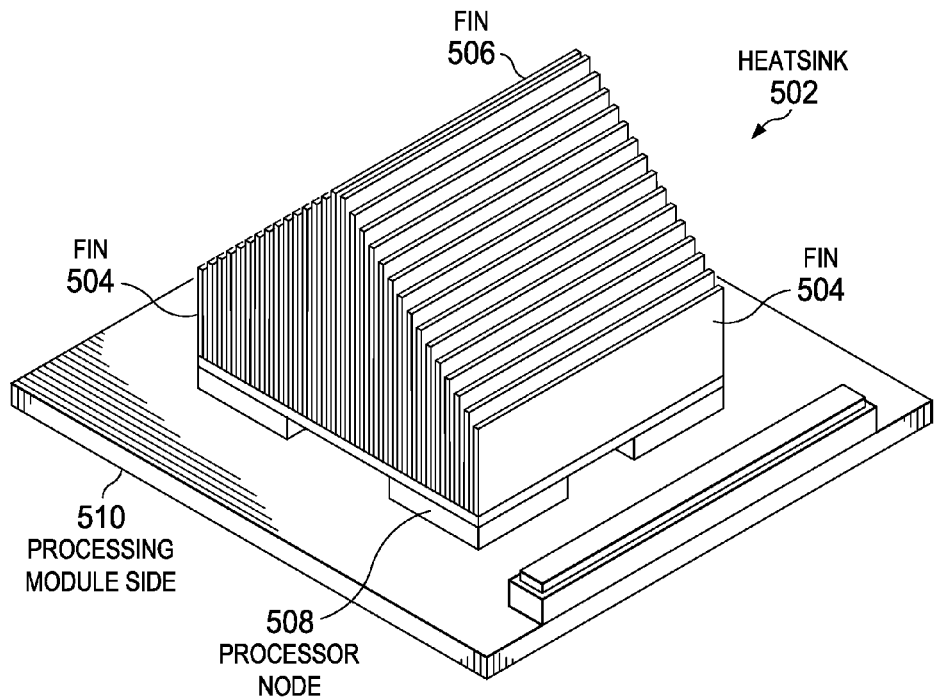
FIG. 5A depicts an exemplary heatsink design that may be used in a processing module in accordance with an illustrative embodiment.
Figure 5A:
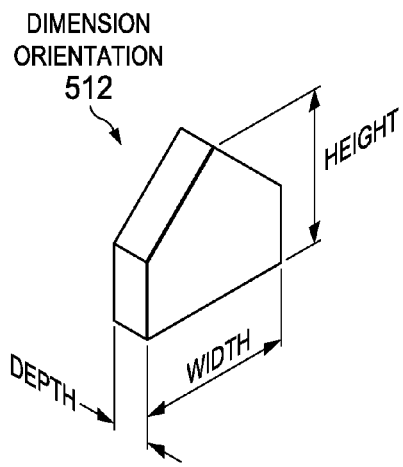

FIG. 5A depicts an exemplary heatsink design that may be used in a processing module in accordance with an illustrative embodiment. As opposed to heatsinks that have common sized fins, heatsink 502 of a processing module is shaped such that fins 504 on the far edges of heatsink 502 are shorter in length than a length of fin 506 in the middle of heatsink 502. Heatsink 502 is constructed in a manner such that within processing module 500 with four heatsinks, the heatsinks fill a majority of the air space within the middle of processing module such that the flow of air passes between the fins of the heatsink increasing the heat exchange surface area. As is also shown in FIG. 5A, heatsink 502 is of a width and depth such that heatsink 502 covers all processing nodes 508 on processing module side 510. Heatsink 502 may be held in place over processing nodes 508 using generally known restrictive methods, such as retaining clips, screws, or the like. Dimension orientation 512 depicts height, width, and depth with relation to the description of heatsink 502. Heatsink 502 may be constructed from either copper, aluminum, or another thermally conductive material.

Figure 5B:
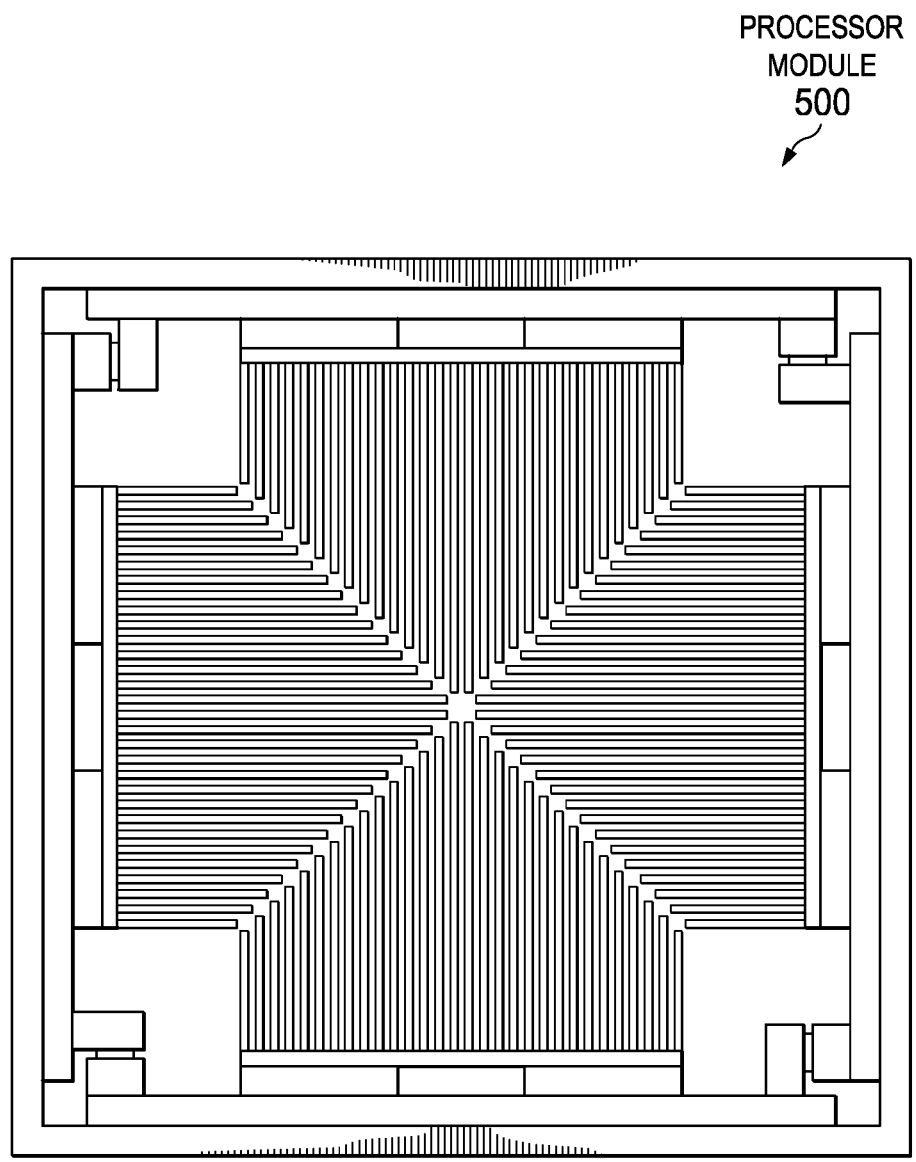
FIG. 5B depicts an example of a constructed processing module that illustrates the majority of the air space within the middle of a processing module being filled in accordance with an illustrative embodiment.

However, in an alternative embodiment (not shown), in order to provide faster access to processor nodes 508 during maintenance, heatsink 502 may be of a width and depth to cover only one portion of processor nodes 508, which would require another one of heatsink 502 to cover the other portion of processor nodes 508 such that the majority of the air space within the middle of processing module is still filled such that the flow of air passes between the fins of the heatsink increasing the heat exchange surface area. For example, one smaller depth heatsink may cover two processor nodes while a similar smaller depth heatsink covers two other processor nodes. While the illustrative embodiments show four of processor nodes 508 on processing module side 510, the illustrative embodiments recognize that more or fewer processing nodes may be implemented such that the width and depth of heatsink 502 requires changing while the height of heatsink 502 in conjunction with other one of heatsink 502 still fill a majority of the air space within the middle of processing module such that the flow of air passes between the fins of the heatsink increasing the heat exchange surface area. FIG. 5B depicts an example of a constructed processing module that illustrates the majority of the air space within the middle of processing module 500 being filled in accordance with an illustrative embodiment.

Figure 6A:
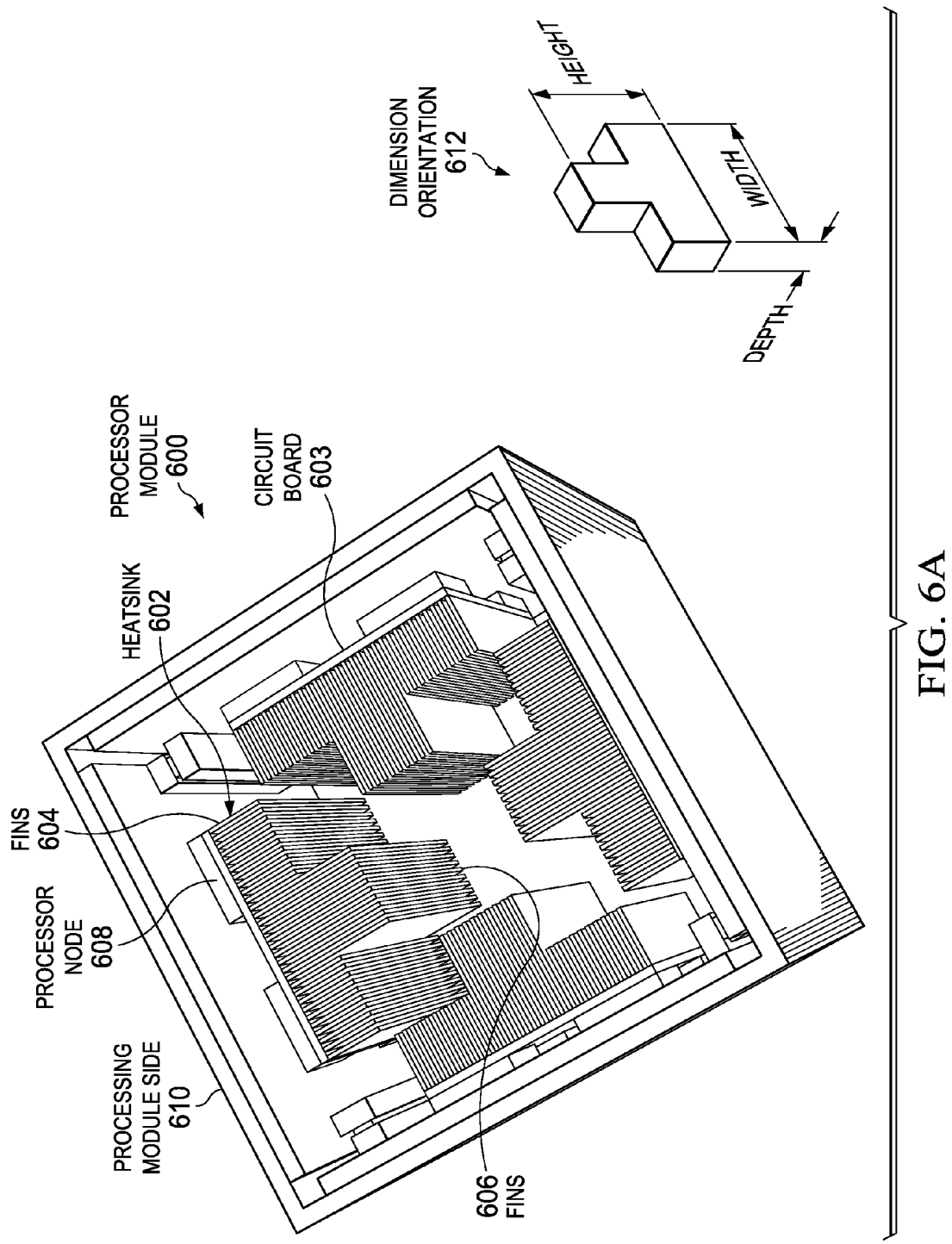
FIG. 6A depicts another exemplary heatsink design that may be used in a processing module in accordance with an illustrative embodiment.

FIG. 6A depicts another exemplary heatsink design that may be used in a processing module in accordance with an illustrative embodiment. Again, as opposed to heatsinks that have a common sized fins, heatsink 602 of processing module 600 is shaped such that a plurality of fins 604 toward the ends of heatsink 602 are shorter in length than a plurality of fins 606 in the middle of heatsink 602. Heatsink 602 is of a width and depth such that heatsink 602 covers all processing nodes 608 on processing module side 610. Heatsink 602 may be held in place over processing nodes 608 using generally known restrictive methods, such as retaining clips, screws, or the like. Dimension orientation 612 depicts height, width, and depth with relation to the description of heatsink 602.

Figure 6B:
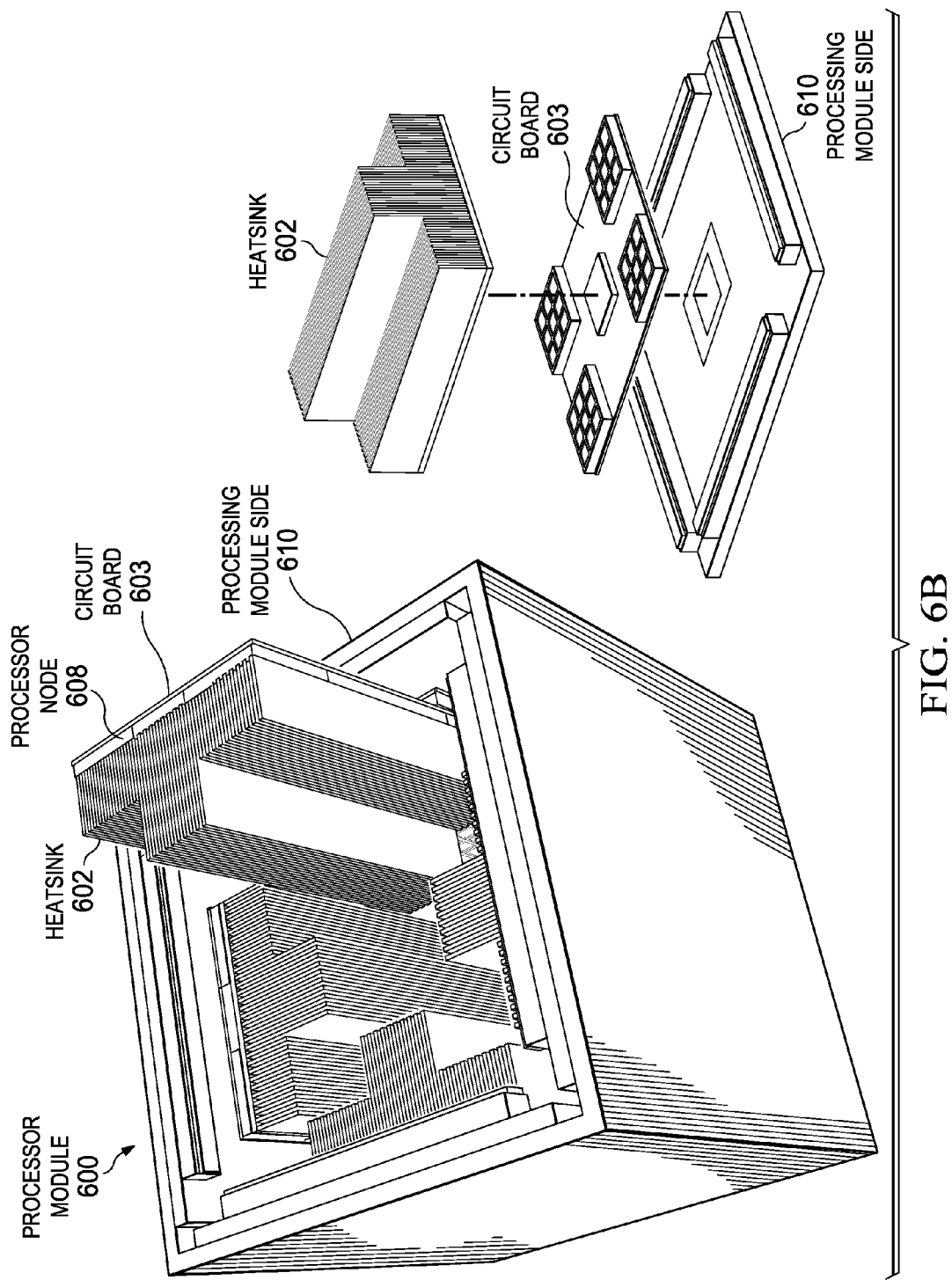
FIG. 6B illustrates removal of a heatsink and circuit board from a processing module side in accordance with an illustrative embodiment.

However, in an alternative embodiment (not shown), in order to provide faster access to processor nodes 608 during maintenance, heatsink 602 may be of a width and depth to cover only one portion of processor nodes 608, which would require another one of heatsink 602 to cover the other portion of processor nodes 608. For example, one smaller depth heatsink may cover two processor nodes while a similar smaller depth heatsink covers two other processor nodes. While the illustrative embodiments show four of processor nodes 608 on processing module side 610, the illustrative embodiments recognize that more or fewer processing nodes may be implemented such that the width and depth of heatsink 602 requires changing. Heatsink 602 is constructed in a manner such that within processing module 600 with four of heatsink 602, the sizing of the heatsinks allows the removal of the heatsink 602 and circuit board 603 from the processing module side 610, while the three other heatsinks remain in place, as is shown in FIG. 6B. Circuit board 603 may be coupled to processing module side 610 by a mechanical mechanism, a magnetic mechanism, or the like, such that circuit board 603 may be easily removed and replaced. However, to enable this design of heatsink 602, an empty space is left in the center of processing module 600.

Figure 6C:
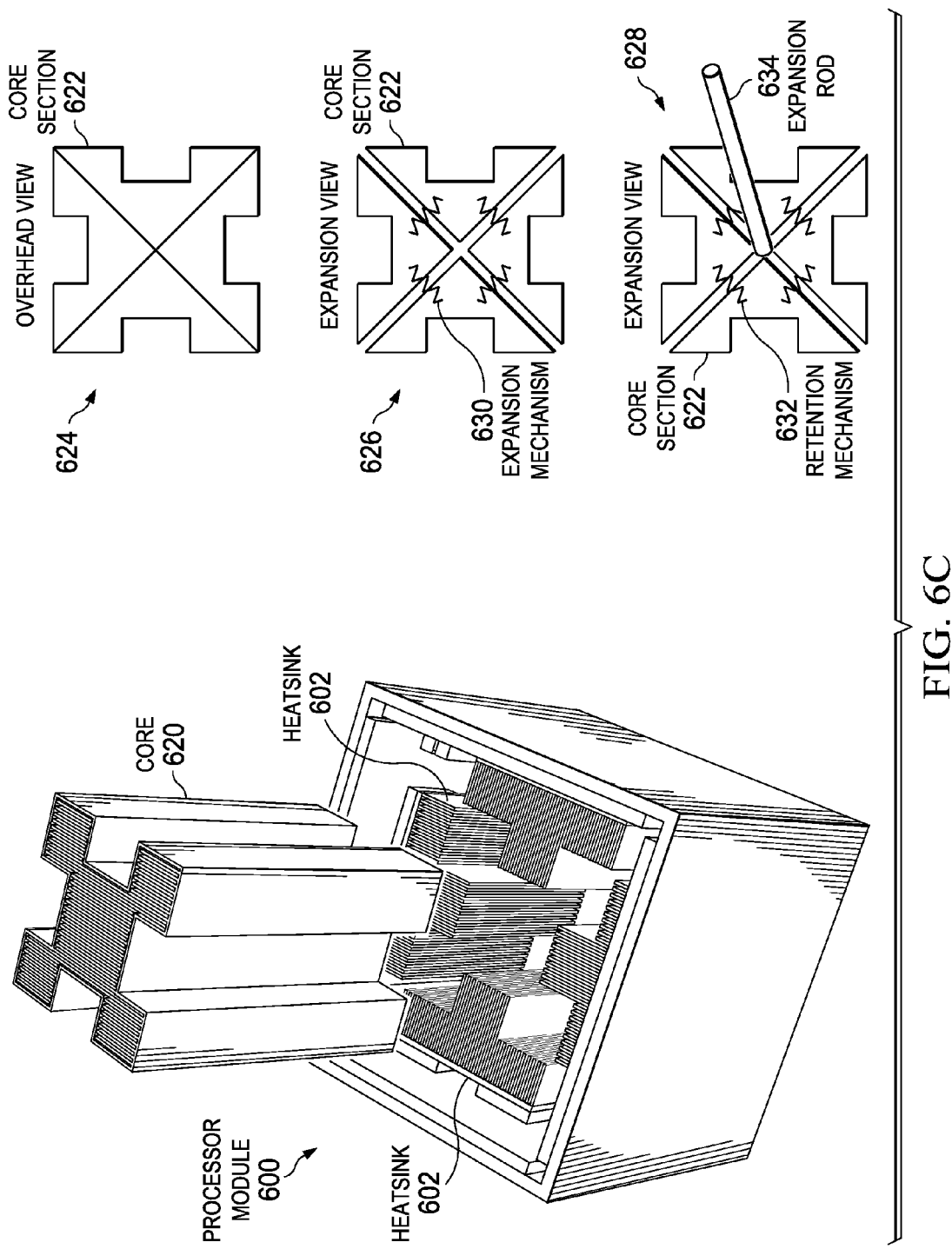
FIG. 6C depicts a core that may be inserted into an empty space in the center of a processing module in accordance with an illustrative embodiment.

FIG. 6C depicts a core that may be inserted into an empty space in the center of a processing module in accordance with an illustrative embodiment. Core 620 may be inserted into the empty area of processing module 600 to fill the air gap left by the use of four of heatsinks 602. Core 620 may be either a solid or impervious core that air flows around and across heatsinks 602 or may be another heatsink (pervious) that increases the heat exchange of heatsinks 602. If core 620 is an impervious core, then core 620 may be comprised of non-heat conductive material, such as rubber, plastic, or the like. If core 620 is of a pervious to airflow design in order to provide added heat exchange to heatsinks 602, then core 620 may be comprised of a thermally conductive material, such as copper, aluminum, or the like.

If core 620 is to provide additional heat exchange, then core 620 may be comprised of multiple core sections 622 as shown in overhead view 624. Core sections 622 may be attached in various methods so that once inserted in the empty area between heatsinks 602 in processing module 600, core 620 may expand to maintain thermal conduction of each of heatsinks 602. In one embodiment, core sections 622 may be coupled using expansion mechanisms, such that when a plurality of retention fasteners, such as latches, snap rings, pins, or the like, are released at the top and bottom of core 620, expansion mechanisms 630 expand forcing cores sections 622 apart and onto heatsinks 602 as in show in expansion view 626. When core 620 is to be removed, a user may use the plurality of latches, snap rings, pins, or the like, to pull core sections 622 back together and away from heatsinks 602 so that core 620 may easily be removed. In another embodiment, core sections 622 may be coupled using retention mechanisms 632, such that when expansion rod 634 is inserted into the center of core 620, retention mechanisms 632 are forced to expand which forces cores sections 622 apart and onto heatsinks 602 as in show in expansion view 628. When the expansion rod is removed from the center of core 620 retention mechanisms 632 pull the cores sections 622 back together and away from heatsinks 602 so that core 620 may easily be removed.

The use of core 620 allows maintenance to be performed on processing module 600 without dissembling processing module 600. In order to increase heat conductivity between heatsinks 602 and core sections 622, the edges of core 620 that will come in contact with heatsink 602 may be coated with a thermal conductive paste prior to being inserted into the empty area between heatsinks 602 in processing module 600.

Figure 6D:
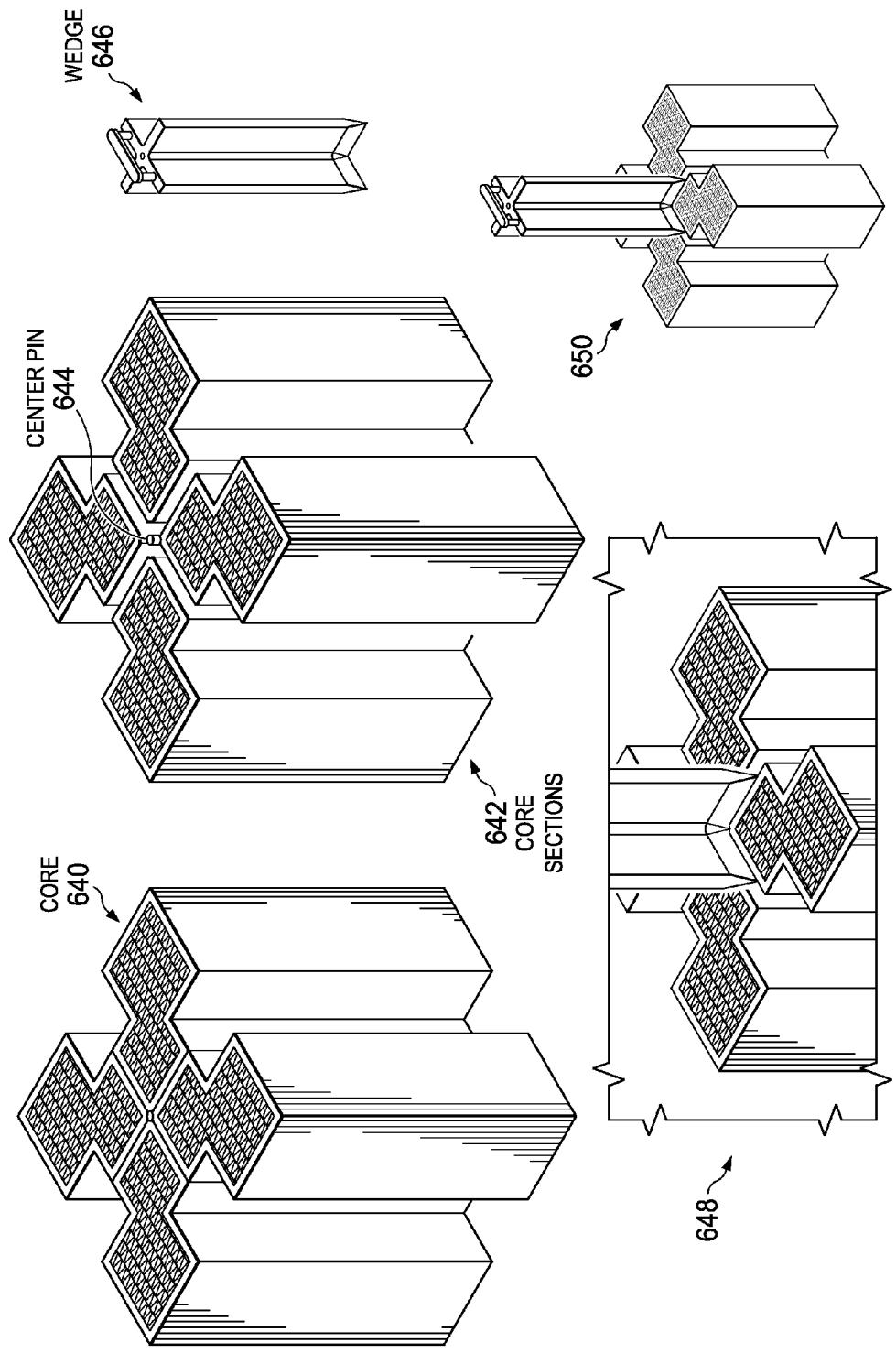
FIG. 6D illustrates another embodiment of an expanding core in accordance with an illustrative embodiment.

FIG. 6D illustrates another embodiment of an expanding core in accordance with an illustrative embodiment. In FIG. 6D, core 640 comprises four core sections 642 with a center pin 644. Center pin 644, which may be removable, at the center of core 640 acts as a guide to prevent core 640 from touching the board mounted heatsinks. While not shown, center pin 644 may be affixed to a aerated base plate at the bottom of module 600 or a stack of modules such that when core 640 is inserted into the module or stack of modules, center pin 644 acts as a guide so that the exterior edges of core 640 does not contact any heatsink in the module. This is especially important to maintain the thermal material on the surfaces of core 640 that will come in contact with the board mounted heatsinks, preventing the thermal material from being wiped out during sliding core 640 into the module. The thermal material and the applied pressure between core 640 and the heatsinks of the processing module are both important to maintain high thermal conductivity between the two components for efficient cooling of core 640. When wedge 646 is inserted into core 640, core 640 expands so that the sides of core 640 come into contact with the heatsinks of the processing module as is shown in expansion views 648 and 650.

Figure 7A:
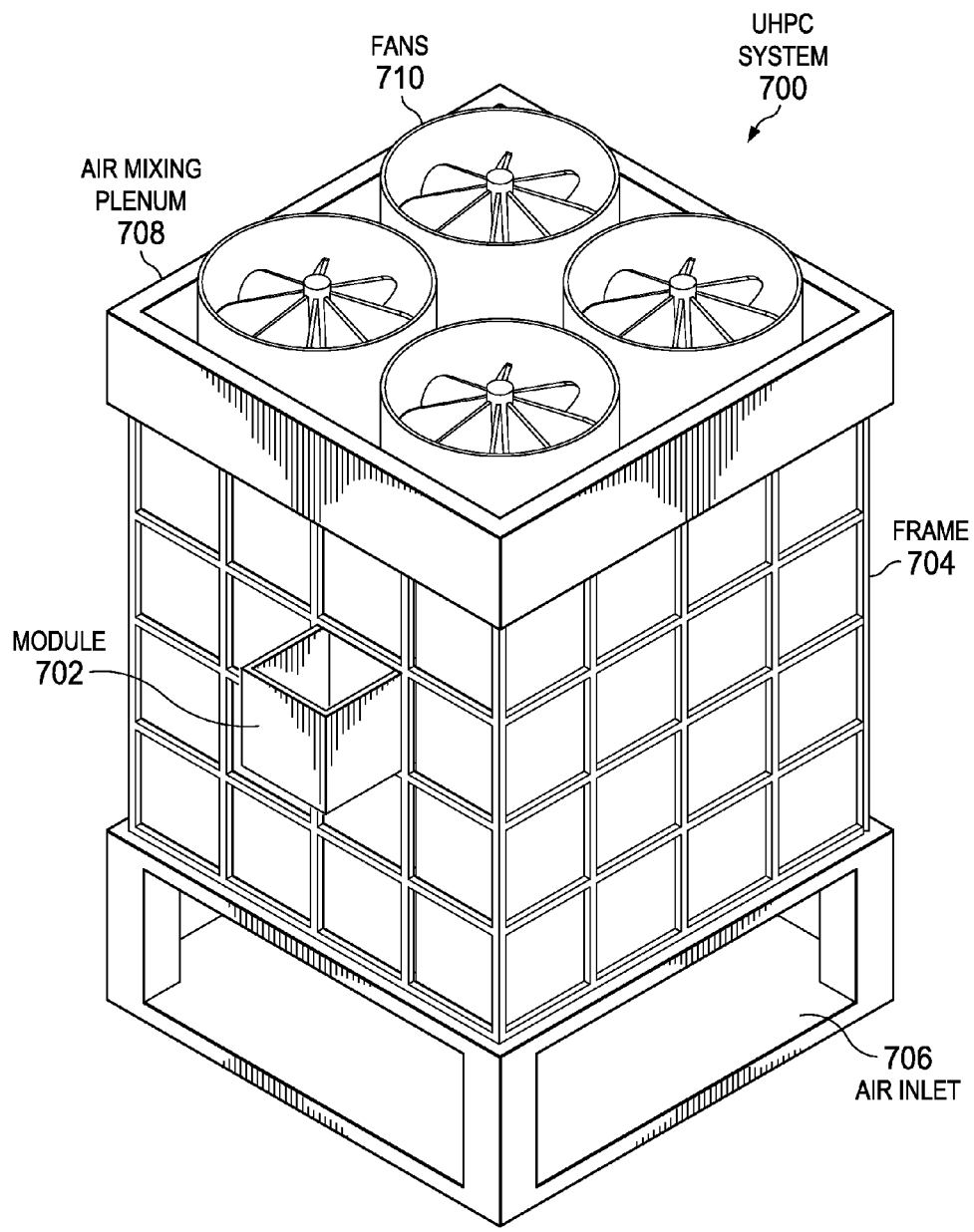
FIG. 7A depicts an example of a scalable space-optimized and energy-efficient computing system in accordance with an illustrative embodiment.

FIG. 7A depicts an example of a scalable space-optimized and energy-efficient computing system in accordance with an illustrative embodiment. In FIG. 7A, a ubiquitous high performance computing (UHPC) system 700 provides a compact arrangement of modules 702 configured in frame 704 that reduces communication cost, reduces cooling cost, provides reliable operation, and facilitates maintainability. The modular design of UHPC system 700 provides these benefits by assembling the modules in a hexadron (non-regular cube) according to the computing needs of the end-user which reduces distance for the communication links. UHPC system 700 comprises frame 704, modules 702, air inlet 706, air mixing plenum 708, and one or more cooling fans 710. Each of modules 702 may be either a processing module, a storage module, an input/output (I/O) module, or a filler module, as previously described, and may be installed in frame 704 similar to a drawer as is illustrated. The other components of UHPC system 700 will now be described in detail.

Figure 7B:
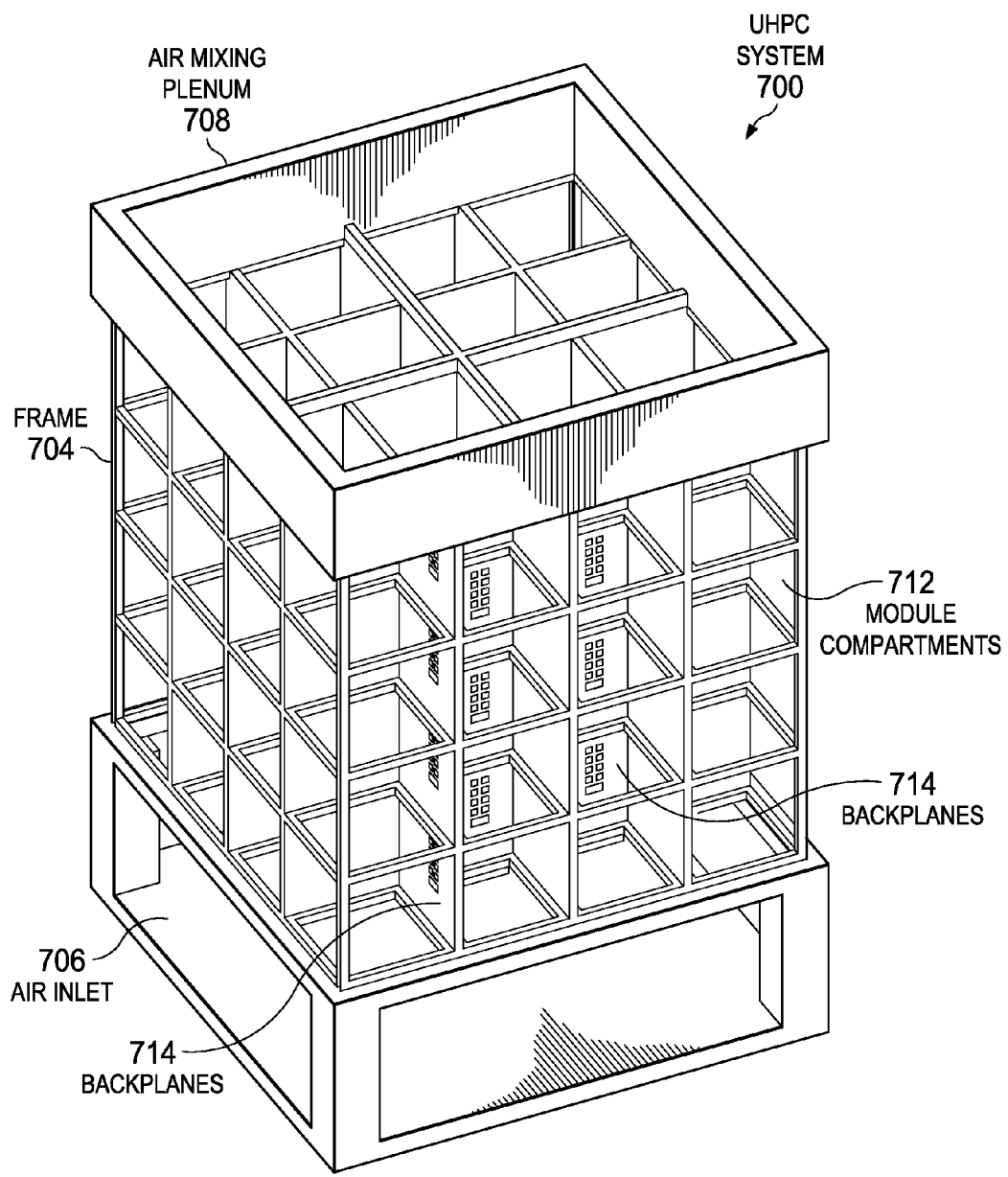
FIG. 7B depicts an exemplary frame of a ubiquitous high-performance computing (UHPC) system in accordance with an illustrative embodiment.

FIG. 7B depicts an exemplary frame of a UHPC system in accordance with an illustrative embodiment. Frame 704 provides a plurality of identical module compartments 712 such that any type of module may be inserted into a single one of module compartment 712 and be connected via backplane 714 to power, storage, communication, or whatever access is required by the module. Frame 704 provides sections between each of module compartments 712 so that cabling may be run between the various connectors of the backplanes as well as to external power and network connects for environments where UHPC system 700 is deployed. Additionally, the top and bottom of each of module compartments 712 are open so that air may flow through each column of module compartments 712 from the air inlet 706 to air mixing plenum 708. Each level of module compartments may also be individual sections such that UHPC system 700 may comprise as few as one level up to any number of levels such that the power and cooling needs are still met by UHPC system 700.

Air inlet 706 may be a compartment that has a solid bottom with open sides and top. Each of the sides of air inlet 706 may be constructed such that access panels provide for the insertion and replacement of air filters. Air would flow through the air filters in the sides of air inlet 706 and up through the top of air inlet 706 through module compartments 712 to air mixing plenum 708. The top of air inlet 706 may be constructed in a way that the top section provides knock outs in the dimensions of module compartments 712 so that a user may remove only those knock outs for those columns of module compartments 712 that are populated in frame 704. Using knock outs in air inlet 706 allows the user to cool only those areas of frame 704 that are occupied by modules 702. Further, in the event a knock out is erroneously removed or if modules 702 are removed such that a column of module compartments 712 no longer has any occupying modules 702, filler plates may be provided to replace the knock out.

Figure 7C:
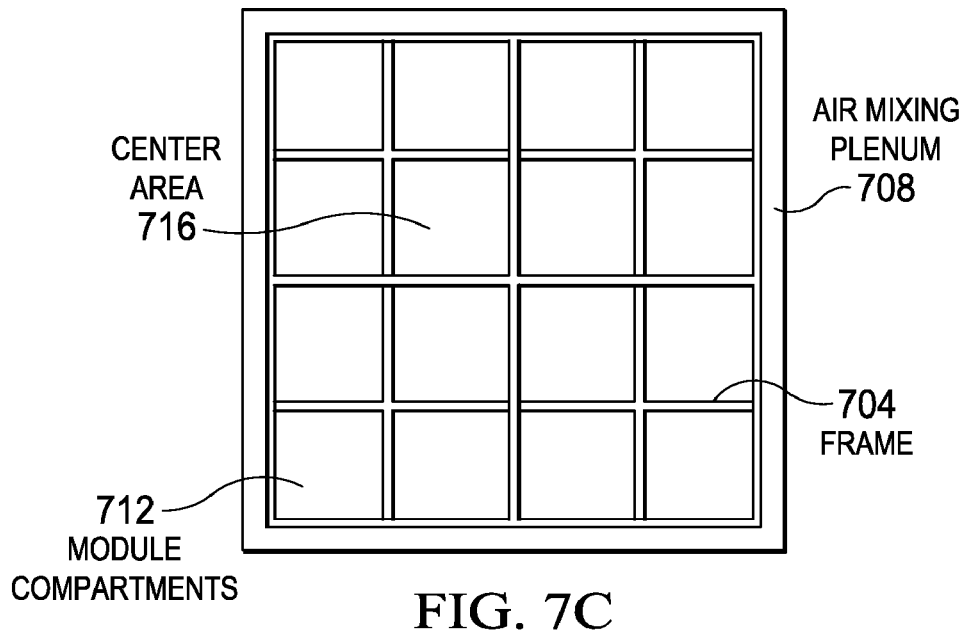
FIG. 7C depicts an exemplary top down view of a UHPC system in accordance with an illustrative embodiment.

FIG. 7C depicts an exemplary top down view of a UHPC system in accordance with an illustrative embodiment. As can be seen in FIG. 7C, air mixing plenum 708 may be a sectional compartment that is placed above the top level of module compartments 712 and covers the outside perimeter of frame 704 such that air flowing up through module compartments 712 will be accumulated in the area of air mixing plenum 708. Also show in FIG. 7C is center area 716 which is shown as empty but may be used for cabling, other modules, or the like. The use of center area 716 for modules is illustrated in a different embodiment that is described below. In this illustration, center area 716 may not have air flow as restricted by air inlet 706 previously described.

Figure 7D:
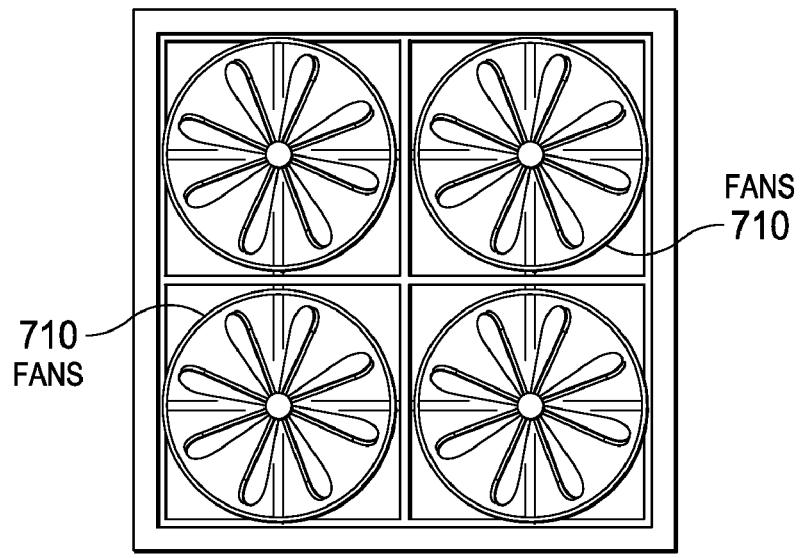
FIG. 7D depicts an exemplary a view of the cooling fans of a UHPC system in accordance with an illustrative embodiment.

FIG. 7D depicts an exemplary view of the cooling fans of a UHPC system in accordance with an illustrative embodiment. In FIG. 7D there are shown four cooling fans 710 each of which draw air though the air inlet at the bottom of the UHPC system, through one or more module compartments, and through the air mixing plenum. Each of fans 710 may be controlled either individually or as a group. That is, dependent on sensed temperature in the UHPC system, fans 710 may be controlled such that one fan turns on when the temperature exceeds one threshold temperature and the other fans may individually turn on as other temperature associated thresholds are exceeded. Likewise, the fans may individually turn off as temperature levels within the UHPC system decrease and the associated temperature thresholds are no longer exceeded. The temperature thresholds may be controlled through simple thermostats associated with each fan or other more complex thermal controls. In an alternative embodiment, fans 710 may be a single fan that has a variable motor that increases to draw more air as the temperature of the UHPC system increases.

Additionally, while the exemplary embodiment illustrates four of fans 710, the illustrative embodiment recognizes that more or fewer fans may be used without departing from the spirit and scope of the invention. Further, while fans 710 are shown on top of the UHPC system, fans 710 may be placed anywhere in the UHPC system such that air is pushed or pulled through the UHPC system. For example, fans 710 may be located below the air inlet, or between the air inlet and the module compartments.

Figure 8A:
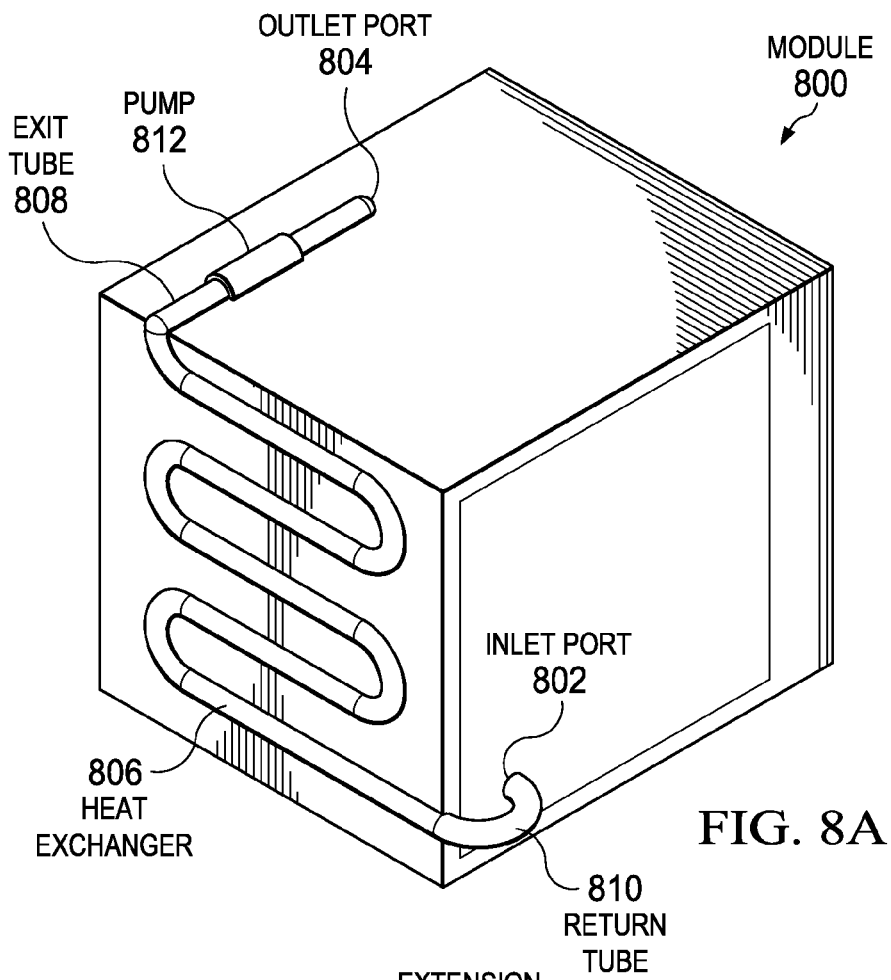
FIG. 8A depicts an exemplary module that is liquid tight and liquid cooled in order to increase heat dissipation in accordance with an illustrative embodiment.

FIG. 8A depicts an exemplary module that is liquid tight and liquid cooled in order to increase heat dissipation in accordance with an illustrative embodiment. In FIG. 8A, module 800 is constructed similar to the modules previously described but also has a top and bottom side that causes the module to be liquid tight other than inlet port 802 and outlet port 804, as well as electrical and optical connections. Inlet port 802 and outlet port 804 may be located at opposing locations on module 800, such that module 800 may be filled with a non-conductive liquid and pump 812 located within or near the module may pump the liquid through module 800. As devices within the module heat the non-conductive liquid, the hot liquid flows out of or exits module 800 via outlet port 804 into exit tube 808 and through heat exchanger 806 which may be located on and coupled to an outside air exposed area of the UHPC system, preferably the module with which the heat exchanger is associated. Exposure of the liquid to the ambient air around the UHPC system through heat exchanger 806 cools the liquids such that, after the liquid finishes its pass through heat exchanger 806, the liquid is returned through return tube 810 back into module 800 via inlet port 802 at a cooler temperature than when it exited module 800. While pump 812 is shown to be located in line with exit tube 808, pump 812 may be located either in the exit line or the return line, whichever is determined to be more efficient. The pump may also be located in a cavity within the heat exchanger, dedicated to host the pump, in order to make it easily accessible for repair and routine pump maintenance.

While not shown in FIG. 8A, the components within module 8A may be cooled with the use of a cold plate mounted on each circuit board, such as circuit board 603 in FIG. 6B, replacing a heatsink, such as heatsink 602 of FIG. 6B. Coolant may be circulated through each cold plate from a common inlet port 802 and out a common outlet port 804. In this embodiment the cooling fluid may be conducting and tilling the module with cooling fluid is not required. Thus, module 800 may not need to be liquid tight. In this embodiment only the interior cooling components of the module are different than the other embodiments discussed.

Figure 8C:
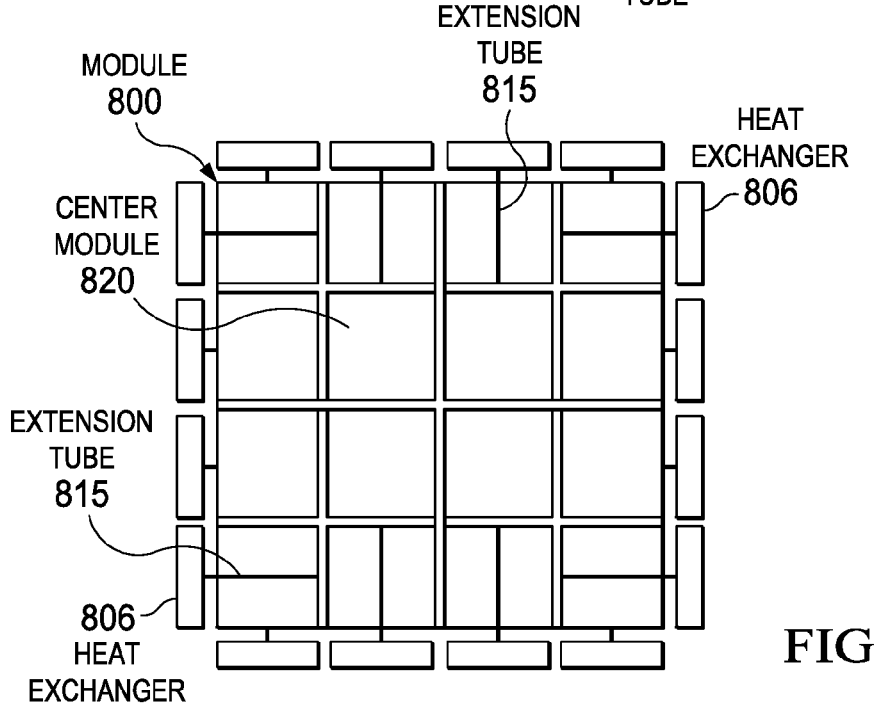
FIG. 8C depicts an exemplary structure where the center area of a UHPC system is populated by one or more modules.
Figure 8B:
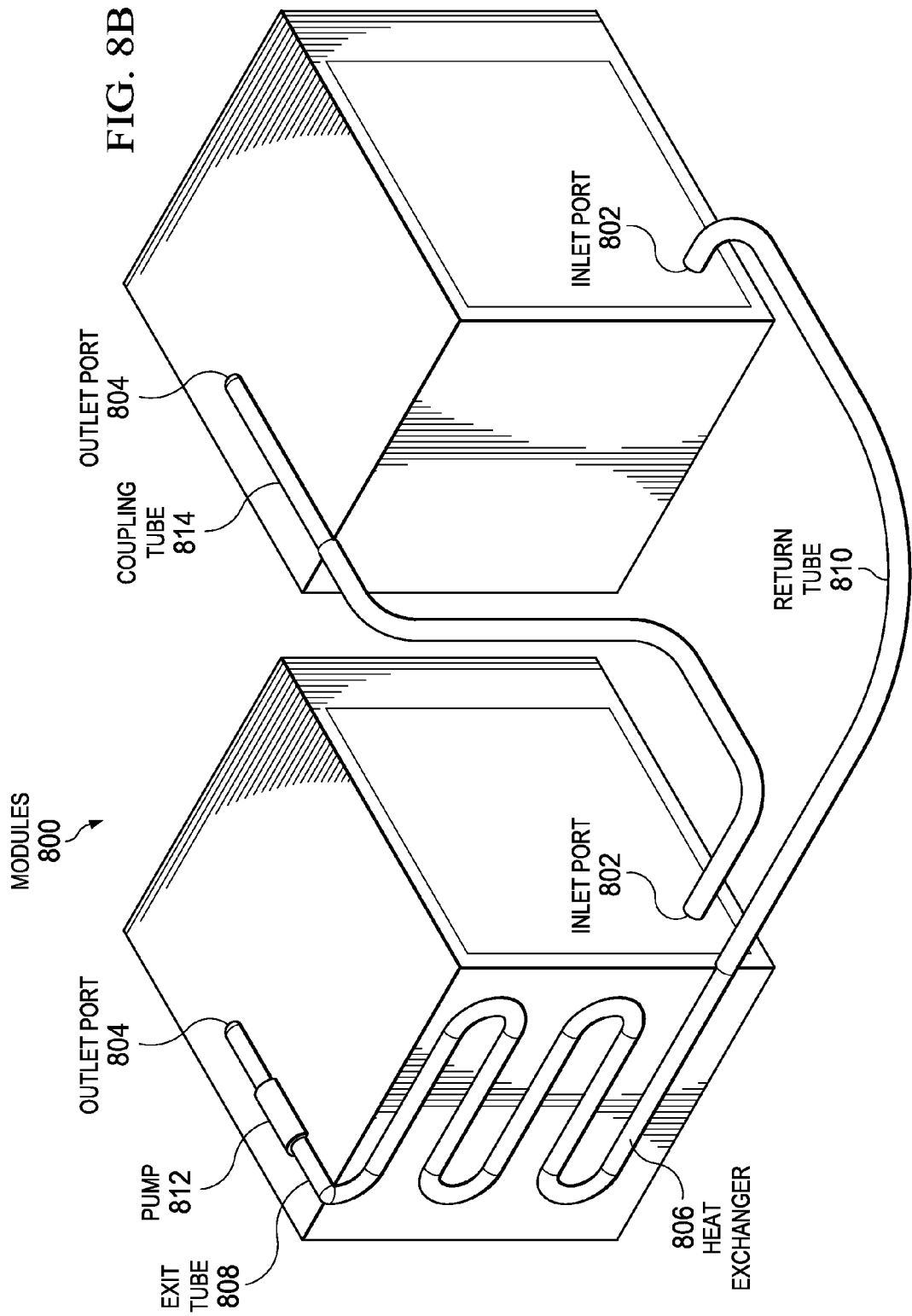
FIG. 8B depicts an exemplary cooling of multiple modules by a single heat exchanger in accordance with an illustrative embodiment.

FIG. 8B depicts an exemplary cooling of multiple modules by a single heat exchanger in accordance with an illustrative embodiment. In this embodiment, heat exchanger 806 provides sufficient cooling such that the liquid may be passed through more than one of modules 800 before being cooled again in heat exchanger 806. In this embodiment, two or more of modules 800 are configured such that outlet port 804 of a first module 800 is coupled to the inlet of its heat exchanger 806 via exit tube 808 and the outlet of heat exchanger 806 is coupled to inlet port 802 of a second module 800 via return tube 810. Then outlet port 804 of the second module 800 is coupled to inlet port 802 of the first module 800 using coupling tube 814.

FIG. 5C depicts an exemplary structure where the center area of a UHPC system is populated by one or more modules. In this illustrative embodiment, liquid tight center modules 820 may be inserted within a given module compartment and coupled to a backplane in order to obtain connectivity to power, communications, storage, or the like. Since these center modules 820 do not have direct access to an outside air exposed area of the UHPC system, extension tubes 815 are used to give the center modules 820 access to the heat exchangers 806 on the exterior perimeter of the UHPC system. In this illustrative embodiment, concern is given with regard to the length of the exit tube and the return tube (shown combined as extension tubes 815) associated with each of modules 800 and center modules 820 so that the shortest distance to and from the heat exchanger is provided.

FIG. 8D depicts how a three-dimensional very-large-scale integration (VLSI) global routing technique may be applied to generate a layout for the tubes, such as exit tubes 808, return tubes 810, coupling tube 814, and extension tube 815 of FIGS. 8A-8C, in accordance with an illustrative embodiment. To solve the problem of routing the heat exchangers to the modules, simple graph 820 is constructed that represents the topology of the modules. There is one vertex 822 per module and a single undirected edge 821 that connects the modules, which abut each other. Edges 821 represent the channels through which tubes are allowed to pass. Each edge 821 is given a capacity which represents the number of tubes which are allowed to pass between adjacent modules. In conventional VLSI global routing, connections of the components are known as a priori, hence fixed. For the routing of the tubes in a UHPC system, there is only one known endpoint per connection and a heat exchanger must connect to each module which requires cooling. To adapt the VLSI global routing techniques to this domain, a unique air vertex 823 is added, which represents the air where heat is eventually radiated. From air vertex 823, undirected edges 821 are added to all of the possible locations where the heat exchangers may be attached. For each of edges 821 that connect air vertex 823 to the 3D mesh, a capacity is assigned that is equal to the number of modules with which the heat exchanger is allowed to be connected. For the remainder of edges 821, their capacities are set as the number of tubes, such as exit tubes 808, return tubes 810, coupling tubes 814, and extension tube 815 of FIG. 8A-8C, that are allowed to pass between the adjacent modules in question. Each module 800 which needs to be cooled may be connected with the air vertex 823. A solution to this routing problem routes tubes to the heat exchangers 806.

FIG. 8E depicts another exemplary structure where the heat exchangers along the walls of a module are replaced by heat exchanger panels in accordance with an illustrative embodiment. In FIG. 8E, heat exchanger panels 832 and 833, which may be pervious or impervious, on the outside of UHPC system 830 represent panels of heat exchangers that may be used to cool the non-conductive liquid coolant that circulates through a plurality of modules 800. Exit tube 808 and return tube 810 transfer the non-conductive liquid coolant to the heat exchanger panels 832 and 833. Extension tubes 815 transfer the non-conductive liquid coolant through modules 800. A particular UHPC system 830 may have heat exchanger panel 832 and/or 833 coupled to a single module 800, in which case there is no need to use extension tubes 815. Each of heat exchanger panels 832 and 833 may be coupled to the surface of UHPC system 830 such that heat exchanger panels 832 and 833 are adjacent to the sides of UHPC system 830, as is shown by heat exchanger panel 832, or each of heat exchanger panels 832 and 833 may be coupled to the surface of UHPC system 830 such that heat exchanger panels 832 and 833 may be tilted away from the sides of UHPC system 830 so that air flow may be increased across the heat exchangers, as is shown by heat exchanger panel 833. Furthermore, cooling of the non-conductive liquid coolant may be facilitated by assisting the flow of air around heat exchanger panels 832 and 833. For that purpose, heat exchanger panels 832 and 833 may be pervious or impervious to air flow.

FIG. 8F depicts a heat exchanger panel in accordance with an illustrative embodiment. In FIG. 8F, heat exchanger 806 is installed in the heat exchanger panel 832. Exit tube 808 and return tube 810 are used to allow the non-conductive liquid coolant to cool. The area of the heat exchanger panel 832 may be smaller, equal to, or larger than the area of the exterior of the UHPC system 830. Heat exchanger panel 832 might dissipate heat on one or many of its sides. For example, heat exchanger 832 that is adjacent to UHPC system 830 may be designed to only dissipate heat by the outer surface. While heat exchanger 833 that is tilted with respect to UHPC system 830 might dissipate heat by the inner and the outer surfaces.

Thus, the illustrative embodiments provide a ubiquitous high-performance computing (UHPC) system that packages the thousands of components of a high-performance computing (HPC) system into building-block modules that may be coupled together to form a space-optimized and energy-efficient product. The illustrative embodiments also provide for various heatsink designs that enable an elegant assembly and in place maintenance for the heatsink and the module, while maintaining large effective heat exchange area and high pressure for efficient cooling. The illustrative embodiments also provide for an alternative to air cooling using a liquid cooling system with coolant/air heat exchanging enabled by skin heat exchangers mounted either on the interior or the exterior surface of the UHPC system.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A modular processing module allowing in-situ maintenance comprising:
a set of processing module sides, wherein each processing module side comprises:
a circuit board;
a plurality of connectors coupled to the circuit board; and
a plurality of processing nodes coupled, to the circuit board, wherein each processing module side in the set of processing module sides couples to another processing module side using at least one connector in the plurality of connectors such that when all of the set of processing module sides are coupled together the modular processing module is formed; and wherein the modular processing module comprises:
an exterior connection to a power source and a communication system; and
at least one heatsink that couples to at least a portion of the plurality of processing nodes on one of the processing module sides, wherein the at least one heatsink is designed such that, when a set of heatsinks in the modular processing module are installed, an empty space is left in a center of the modular processing module, wherein the empty space in the center of the processing module is filled with a core that fills an air gap left by the set of heatsinks in the modular processing module, wherein the core is comprised of a plurality of core sections, wherein the plurality of core sections are coupled together using retention mechanisms, and wherein upon the insertion of an expansion rod in the center of the core, the plurality of core sections move such that the outside edge of each core section contacts one heatsink in the set of heatsinks in the modular processing module.

2. The modular processing module of claim 1, wherein the at least one heatsink has a plurality of fins on either side of a set of middle fins that are a predetermined length shorter than the set of middle fins.

3. The modular processing module of claim 1, wherein the at least one heatsink is removable from the modular processing module without decoupling the set of processing module sides used to form the modular processing module.

4. The modular processing module of claim 1, wherein the core is at least one of an impervious core or a thermally conductive pervious core.

5. The modular processing module of claim 1, wherein the circuit board is a stackable mounted board coupled to the processing module side by at least one of a mechanical mechanism or a magnetic mechanism that allows detachment of the circuit board, the plurality of processing nodes, and the at least one heat sink from the processing module side, while the processing module side is in place within a processing system.

6. A processing system comprising a column of stackable modules allowing in-situ maintenance, wherein each stackable module in the column of stackable modules comprises:
a set of processing module sides, wherein each processing module side comprises:
a circuit board;
a plurality of connectors coupled to the circuit board; and
a plurality of processing nodes coupled to the circuit board, wherein each processing module side in the set of processing module sides couples to another processing module side using at least one connector in the plurality of connectors such that when all of the set of processing module sides are coupled together a modular processing module is formed, and wherein the modular processing module comprises:
an exterior connection to a power source and a communication system; and
at least one heatsink that couples to at least a portion of the plurality of processing nodes on one of the processing module sides, wherein the at least one heatsink is designed such that, when a set of heatsinks in the modular processing module are installed, an empty space is left in the center of the processing module, wherein two or more of the modular processing modules are stacked to form the column of stackable modules, wherein the empty space in the center of the processing system is filled with a core that fills an air gap left by the set of heatsinks in the column of stackable modules, wherein the core is comprised of a plurality of core sections, and wherein upon the insertion of a wedge in the center of the core, the plurality of core sections move such that the outside edge of each core section contacts one heatsink in the set of heatsinks in the column of stackable modules.

7. The processing system of claim 6, wherein the at least one heatsink has a plurality of fins on either side of a set of middle fins that are a predetermined length shorter than the set of middle fins.

8. The processing system of claim 6, wherein the at least one heatsink is removable from the modular processing module without decoupling the set of processing module sides used to form the modular processing module.

9. The processing system of claim 6, wherein a removable guide pin is held in place through the center of the column of stackable modules, wherein the removable guide pin is held in place at one end of the column by a permanent mount of rigid material with a mechanism to release the removable guide pin and with the permanent mount constructed so as to minimally impede the flow of cooling air.

10. The processing system of claim 9, wherein a length of the column of stackable modules and a length of the core are approximately equal and wherein, when the core is fully inserted into the column of stackable modules, the core is guided by the removable guide pin such that exterior edges of the core do not contact any heatsink of the modular processing modules in the column of stackable modules during insertion.

11. The processing system of claim 6, wherein the core is at least one of an impervious core or a thermally conductive pervious core.

12. The processing system of claim 6, wherein the at least one core is water cooled.

13. The processing system of claim 6, wherein the circuit board is a stackable mounted board coupled to the processing module side board by at least one of a mechanical mechanism or a magnetic mechanism that allow detachment of the circuit board, the plurality of processing nodes, and the at least one heat sink from the processing module side, while the processing module side is in place within the processing system.

* * * * *